(12) United States Patent
Yun et al.

(10) Patent No.: US 11,631,791 B2
(45) Date of Patent: *Apr. 18, 2023

(54) SEMICONDUCTOR LIGHT-EMITTING DEVICE

(71) Applicant: SAMSUNG ELECTRONICS CO., LTD., Suwon-si (KR)

(72) Inventors: Mi Jeong Yun, Suwon-si (KR); Jong Sup Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 100 days.

This patent is subject to a terminal disclaimer.

(21) Appl. No.: 17/214,992

(22) Filed: Mar. 29, 2021

(65) Prior Publication Data

US 2021/0217933 A1    Jul. 15, 2021

Related U.S. Application Data

(63) Continuation of application No. 17/019,439, filed on Sep. 14, 2020, now Pat. No. 10,964,854, which is a
(Continued)

(30) Foreign Application Priority Data

Feb. 13, 2015    (KR) ................. 10-2015-0022467

(51) Int. Cl.
*H01L 33/50*        (2010.01)
*H01L 27/15*        (2006.01)
(Continued)

(52) U.S. Cl.
CPC ............ *H01L 33/502* (2013.01); *H01L 33/54* (2013.01); *H01L 33/56* (2013.01); *H01L 33/504* (2013.01);
(Continued)

(58) Field of Classification Search
CPC .............. H01L 33/641; H01L 25/0753; H01L 2224/48091; H01L 2224/73265;
(Continued)

(56) References Cited

U.S. PATENT DOCUMENTS 6,372,608 B1    4/2002  Shimoda et al.
6,645,830 B2    11/2003 Shimoda et al.
(Continued)

FOREIGN PATENT DOCUMENTS

EP      2 479 812 A2    7/2012
JP      2007-66938 A    3/2007
(Continued)

OTHER PUBLICATIONS

Communication dated Feb. 21, 2022 issued by the Korean Intellectual Property Office in counterpart Korean Application No. 10-2021-0190275.
(Continued)

*Primary Examiner* — Mary A Wilczewski
*Assistant Examiner* — Tsz K Chiu
(74) *Attorney, Agent, or Firm* — Sughrue Mion, PLLC

(57) ABSTRACT

A semiconductor light-emitting device includes: a package substrate having a mounting surface on which a first circuit pattern and a second circuit pattern are disposed; a semiconductor LED chip mounted on the mounting surface, having a first surface which faces the mounting surface and on which a first electrode and a second electrode are disposed, a second surface opposing the first surface, and side surfaces located between the first surface and the second surface, the first electrode and the second electrode being connected to the first circuit pattern and the second circuit pattern, respectively; a wavelength conversion film disposed on the second surface; and a side surface inclined portion disposed on the side surfaces of the semiconductor
(Continued)

LED chip, providing inclined surfaces, and including a light-transmitting resin containing a wavelength conversion material.

20 Claims, 14 Drawing Sheets

Related U.S. Application Data continuation of application No. 16/109,047, filed on Aug. 22, 2018, now Pat. No. 10,777,712, which is a continuation of application No. 14/985,784, filed on Dec. 31, 2015, now Pat. No. 10,084,118.

(51) Int. Cl.
*H01L 33/56* (2010.01)
*H01L 33/54* (2010.01)
*H01L 33/60* (2010.01)
*H01L 33/58* (2010.01)

(52) U.S. Cl.
CPC .............. *H01L 33/58* (2013.01); *H01L 33/60* (2013.01); *H01L 2224/16225* (2013.01); *H01L 2224/48091* (2013.01); *H01L 2224/48247* (2013.01); *H01L 2224/73253* (2013.01); *H01L 2933/005* (2013.01); *H01L 2933/0058* (2013.01)

(58) Field of Classification Search
CPC ... H01L 2924/00014; H01L 2933/0041; H01L 2933/005; H01L 2933/0091; H01L 2924/12041; H01L 33/60; H01L 33/483; H01L 33/504; H01L 33/505; H01L 33/62; H01L 33/54; H01L 33/502; H01L 33/48; H01L 33/36

See application file for complete search history.

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,078,732 B1 | 7/2006 | Reeh et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,429,757 B2 | 9/2008 | Oyama |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,217,488 B2 | 7/2012 | Chen et al. |
| 8,263,987 B2 | 11/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,455,907 B2 | 6/2013 | Waragawa et al. |
| 8,459,832 B2 | 6/2013 | Kim |
| 8,502,242 B2 | 8/2013 | Kim |
| 8,536,604 B2 | 9/2013 | Kwak et al. |
| 8,581,287 B2 | 11/2013 | Waragaya et al. |
| 8,735,931 B2 | 5/2014 | Han et al. |
| 8,766,295 B2 | 7/2014 | Kim |
| 8,860,047 B2 | 10/2014 | Morimoto |
| 9,219,208 B2 * | 12/2015 | Yoon ........................ H01L 33/62 |
| 9,224,925 B2 | 12/2015 | Mochizuki |
| 9,299,895 B1 * | 3/2016 | Hsing Chen .......... H01L 33/486 |
| 9,799,809 B2 | 10/2017 | Yoo |
| 9,905,543 B2 | 2/2018 | Yeon |
| 10,121,945 B2 * | 11/2018 | Kim ........................ H01L 33/62 |
| 2005/0133808 A1 | 6/2005 | Uraya et al. |
| 2006/0022211 A1 | 2/2006 | Yatsuda et al. |
| 2007/0023769 A1 | 2/2007 | Nishimoto et al. |
| 2007/0086148 A1 | 4/2007 | Schwenkschuster |
| 2007/0278935 A1 | 12/2007 | Harada |
| 2008/0054279 A1 | 3/2008 | Hussell et al. |
| 2009/0001490 A1 | 1/2009 | Bogner |
| 2009/0134417 A1 | 5/2009 | Sato et al. |
| 2009/0200570 A1 | 8/2009 | Mori et al. |
| 2011/0180822 A1 | 7/2011 | Ruhnau et al. |
| 2011/0215354 A1 | 9/2011 | Wang |
| 2011/0215360 A1 | 9/2011 | Wang |
| 2012/0235169 A1 | 9/2012 | Seko et al. |
| 2013/0141905 A1 | 6/2013 | Hussell et al. |
| 2013/0277681 A1 | 10/2013 | Wada et al. |
| 2014/0054621 A1 | 2/2014 | Seko |
| 2014/0192542 A1 | 7/2014 | Sakumoto |
| 2014/0226345 A1 | 8/2014 | Song et al. |
| 2018/0175265 A1 * | 6/2018 | Kim ....................... H01L 33/483 |

FOREIGN PATENT DOCUMENTS

| | | |
|---|---|---|
| JP | 2010-171341 A | 8/2010 |
| JP | 4655029 B2 | 3/2011 |
| JP | 2012-156180 A | 8/2012 |
| JP | 2013-12545 A | 1/2013 |
| JP | 2013-211250 A | 10/2013 |
| JP | 2014-41942 A | 3/2014 |
| JP | 2014-093419 A | 5/2014 |
| JP | 2014-207349 A | 10/2014 |
| JP | 2015-500570 A | 1/2015 |
| KR | 10-0610650 B1 | 8/2006 |
| KR | 10-2006-0134491 A | 12/2006 |
| WO | 2013/035529 A1 | 3/2013 |

OTHER PUBLICATIONS

Communication dated Apr. 5, 2021, issued by the Korean Intellectual Property Office in Korean Application No. 10-2015-0022467.
Communication dated Sep. 29, 2021, issued by the Korean Intellectual Property Office in Korean Application No. 10-2015-0022467.
Communication dated Aug. 17, 2022 by the Korean Patent Office for Korean Patent Application No. 10-2021-0190275.

* cited by examiner

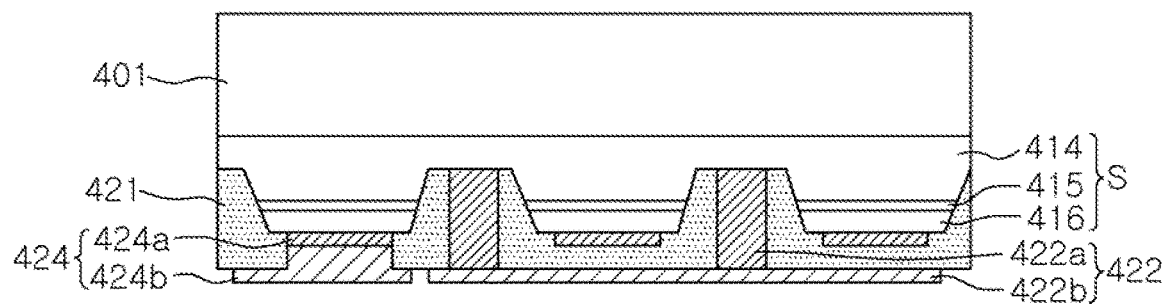
FIG. 8
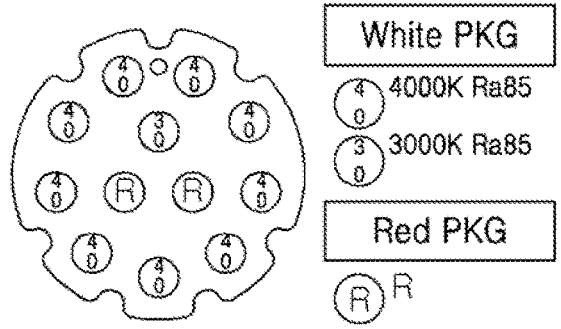 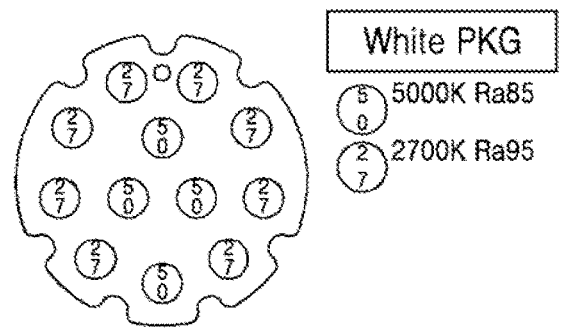
FIG. 9A　　　　　　　FIG. 9B

SEMICONDUCTOR LIGHT-EMITTING DEVICE

CROSS-REFERENCE TO THE RELATED APPLICATIONS

This is a continuation of U.S. application Ser. No. 17/019,439, filed on Sep. 14, 2020, which is a continuation of U.S. application Ser. No. 16/109,047, filed on Aug. 22, 2018, now U.S. Pat. No. 10,777,712, issued Sep. 15, 2020, which is a continuation of U.S. application Ser. No. 14/985,784 filed Dec. 31, 2015, now U.S. Pat. No. 10,084,118, issued Sep. 25, 2018, which claims priority from Korean Patent Application No. 10-2015-0022467 filed on Feb. 13, 2015, with the Korean Intellectual Property Office, the disclosure of which is incorporated herein in its entirety by reference.

BACKGROUND

Apparatuses and methods consistent with exemplary embodiments relate to a semiconductor light-emitting device.

A semiconductor light-emitting diode (LED) is an element containing semiconductor materials which, when electrical energy is applied thereto, emits light through electron-hole recombination due to the application of electrical energy. The LED is widely being used as a light source of general lighting devices and a backlight unit of large-scale liquid crystal display (LCD) devices, and accordingly, the development thereof is currently being accelerated.

In general, LEDs may be provided as light-emitting devices packaged in a variety of forms to be easily provided in application devices. In the process of packaging such LEDs, disadvantageous effects such as deteriorations of light emission efficiency or increase in color deviation may occur in a product due to light loss and total internal reflection caused by other components.

SUMMARY

Exemplary embodiments of the inventive concept provide a semiconductor light-emitting device having improved light extraction efficiency through a significant reduction of light loss due to total internal reflection.

According to an exemplary embodiment, there is provided a semiconductor light-emitting device which may include: a package substrate having a mounting surface on which a first circuit pattern and a second circuit pattern are disposed; a semiconductor LED chip mounted on the mounting surface, having a first surface which faces the mounting surface and on which a first electrode and a second electrode are disposed, a second surface opposing the first surface, and side surfaces located between the first surface and the second surface, the first electrode and the second electrode being connected to the first circuit pattern and the second circuit pattern, respectively; a wavelength conversion film disposed on the second surface; and a side surface inclined portion disposed on the side surfaces of the semiconductor LED chip, providing inclined surfaces, and including a light-transmitting resin containing a wavelength conversion material.

The semiconductor light-emitting device may further include a light-transmitting adhesive layer disposed between the wavelength conversion film and the semiconductor LED chip. In this case, the light-transmitting adhesive layer may include the same light-transmitting resin as the light-transmitting resin of the side surface inclined portion. The light-transmitting adhesive layer may include the same wavelength conversion material as the wavelength conversion material of the side surface inclined portion.

The wavelength conversion material of the side surface inclined portion may contain the same material as the material contained in the wavelength conversion film.

The wavelength conversion film may have an area greater than an area of the semiconductor LED chip.

The semiconductor light-emitting device may further include a side surface reflection portion which is disposed on the mounting surface of the package substrate to surround the side surface inclined portion and includes the inwardly inclined surfaces by contacting the side surface inclined portion. The inwardly inclined surfaces may be used to guide light emitted from the semiconductor LED chip toward the wavelength conversion film. In this case, the side surface reflection portion may include a light-transmitting resin in which a reflective powder is contained. The reflective powder may be a white ceramic powder or a metal powder.

The package substrate may include a cup-shaped reflective structure disposed on the mounting face to surround the side surface reflection portion, and the semiconductor light-emitting device may further include an optical lens disposed on the wavelength conversion film.

According to an exemplary embodiment, there is provided a semiconductor light-emitting device which may include: a package substrate having a mounting surface on which a first circuit pattern and a second circuit pattern are disposed; a semiconductor LED chip mounted on the mounting surface of the package substrate, having a first surface which faces the mounting surface and on which a first electrode and a second electrode are disposed, a second surface opposing the first surface, and side surfaces located between the first surface and the second surface, the first electrode and the second electrode being connected to the first circuit pattern and the second circuit pattern, respectively; a wavelength conversion film disposed on the second surface of the semiconductor LED chip, a side surface inclined portion disposed on the side surfaces of the semiconductor LED chip, providing a surface inclined inwardly toward the mounting surface of the package substrate, and composed of a light-transmitting resin containing a light dispersing material; and a side surface reflection portion disposed on the mounting surface of the package substrate to surround the side surface inclined portion.

The light dispersing material may contain at least one selected from a group consisting of $SiO_2$, $Al_2O_3$, and $TiO_2$.

According to an exemplary embodiment, there is provided semiconductor light-emitting device which may include: a substrate; a semiconductor LED chip mounted on the substrate, having a first surface which faces the substrate, a second surface opposing the first surface, and side surfaces connecting the first surface and the second surface; a wavelength conversion film disposed on the second surface of the semiconductor LED chip; and a side surface structure disposed on the side surfaces of the semiconductor LED chip configured to reflect light emitted from the semiconductor LED chip toward the wavelength conversion film, and comprising a light-transmitting resin containing a wavelength conversion material or a light dispersing material which is different from the wavelength conversion material.

In a case that the light-transmitting resin contains the light dispersing material, the light-transmitting resin and the light dispersing material may have different refractive indexes.

The wavelength conversion film may include a yellow phosphor, and the light-transmitting resin may include a red phosphor or a green phosphor.

The semiconductor light-emitting device may further include a light-transmitting adhesive layer disposed between the wavelength conversion film and the semiconductor LED chip. Here, the light-transmitting adhesive layer and the side surface structure may include a same material.

BRIEF DESCRIPTION OF THE DRAWINGS

The above and other aspects, features, and advantages will be more clearly understood from the following detailed description taken in conjunction with the accompanying drawings, in which:

FIG. 7 and FIG. 8 are cross-sectional views illustrating various examples of a semiconductor LED chip which may be employed in the semiconductor light-emitting device according to an exemplary embodiment;

FIG. 9A and FIG. 9B are schematic views illustrating examples of a light source module using a semiconductor light-emitting device according to an exemplary embodiment;

DETAILED DESCRIPTION OF THE EXEMPLARY EMBODIMENTS

Figure 1:
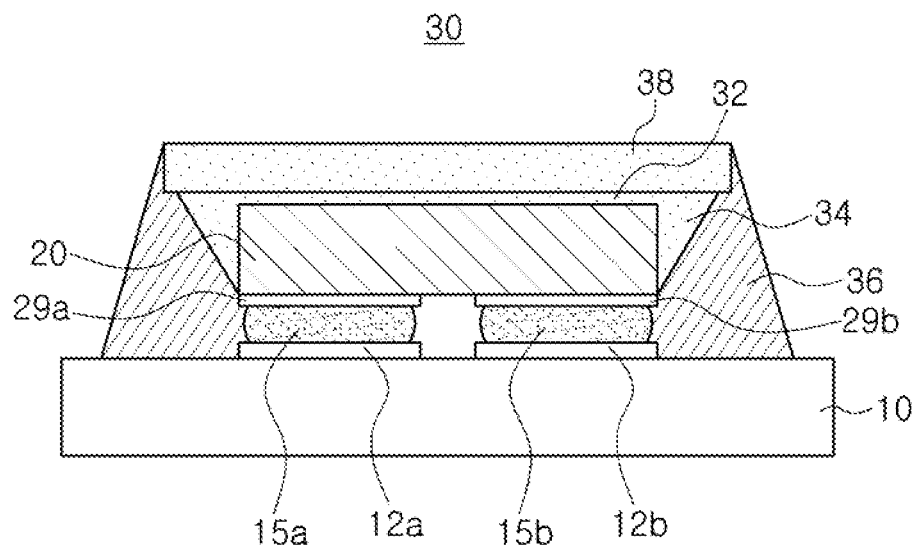
FIG. 1 is a side cross-sectional view illustrating a semiconductor light-emitting device according to an exemplary embodiment.

Exemplary embodiments of the present inventive concept will now be described in detail with reference to the accompanying drawings.

The inventive concept may, however, be exemplified in many different forms and should not be construed as being limited to the specific embodiments set forth herein. Rather, these embodiments are provided so that this disclosure will be thorough and complete, and will fully convey the scope of the inventive concept to those skilled in the art. In the drawings, the shapes and dimensions of elements may be exaggerated for clarity, and the same reference numerals will be used throughout to designate the same or like elements. In this disclosure, terms such as "above", "upper portion", "upper surface", "below", "lower portion", "lower surface", "lateral surface", and the like, are determined based on the drawings, and in actuality, the terms may be changed according to a direction in which a device or an element is disposed.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will also be understood that when a layer is referred to as being "on" another layer or substrate, it can be directly on the other layer or substrate, or intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

The expression "an exemplary embodiment or one example" used in the present disclosure does not refer to identical examples and is provided to stress different unique features between each of the examples. However, an example or exemplary embodiment provided in the following description is not excluded from being associated with one or more features of another example or another exemplary embodiment also provided therein or not provided therein but consistent with the inventive concept. For example, even if matters described in a specific example are not described in a different example thereto, the matters may be understood as being related to the other example, unless otherwise mentioned in descriptions thereof.

Figure 2:
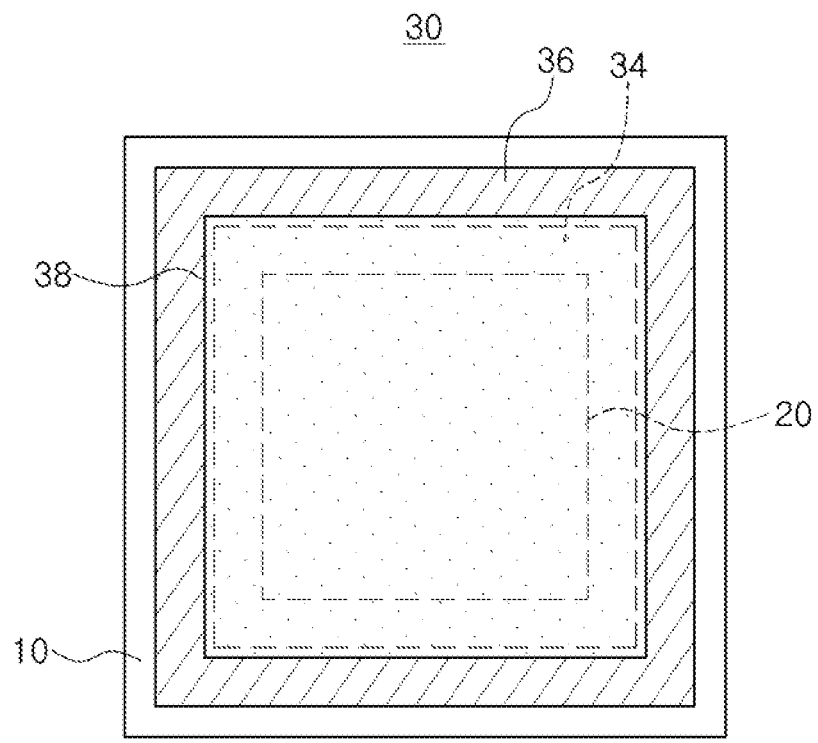
FIG. 2 is a plan view illustrating the semiconductor light-emitting device of FIG. 1.

FIG. 1 is a cross-sectional view illustrating a semiconductor light-emitting device according to an exemplary embodiment, and FIG. 2 is a plan view illustrating the semiconductor light-emitting device of FIG. 1.

Referring to FIG. 1, a semiconductor light-emitting device 30 according to an exemplary embodiment of the present disclosure may include a package substrate 10 having a mounting surface, and a semiconductor light-emitting diode (LED) chip 20 mounted above the mounting surface of the package substrate 10.

The package substrate 10 may include first and second circuit patterns 12a and 12b disposed on the mounting surface. The first and second circuit patterns 12a and 12b may be extended onto side surfaces or onto the lower surface of the package substrate. The package substrate 10 may include an insulating resin, a ceramic substrate, or the like. The first and second circuit patterns 12a and 12b may include a metallic component such as Au, Cu, Ag, and Al. For example, the package substrate 10 may be a Printed Circuit Board (PCB), a Metal Core PCB (MCPCB), a Metal PCB (MPCB), a Flexible PCB (FPCB), or the like.

The semiconductor LED chip 20 may have a first surface on which first and second electrodes 29a and 29b are disposed, a second surface opposing the first surface, and side surfaces connecting the first surface and the second surface. The semiconductor LED chip 20 may be mounted in such a manner that the first surface faces the mounting surface, and the first and second electrodes 29a and 29b may be connected to the first and second circuit patterns 12a and 12b by solder balls 15a and 15b, respectively.

Figure 3:
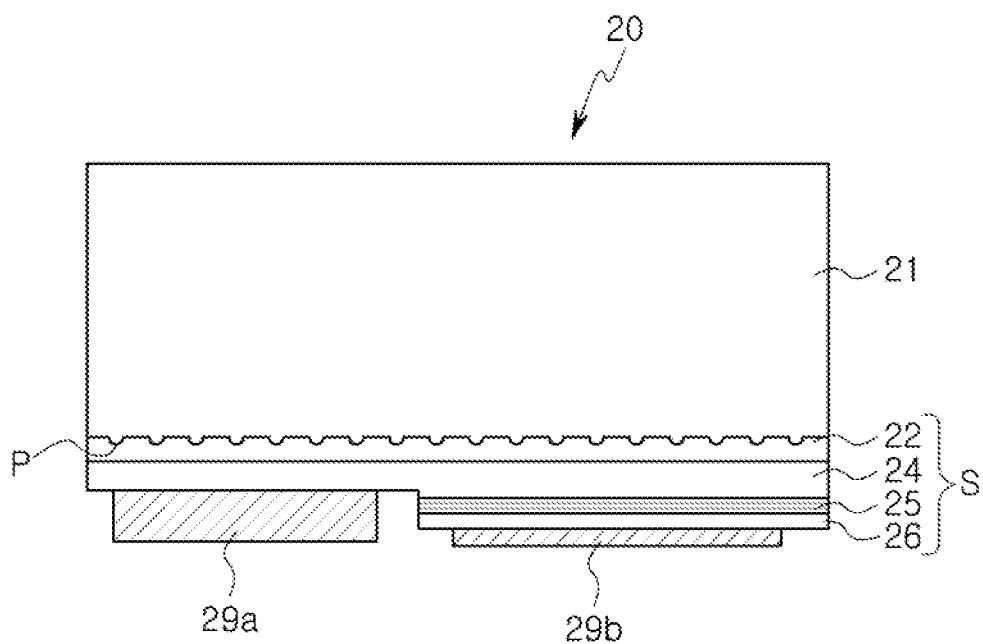
FIG. 3 is side a cross-sectional view illustrating a semiconductor LED chip employed in the semiconductor light-emitting device of FIG. 1.

As illustrated in FIG. 3, the semiconductor LED chip 20 employed in the exemplary embodiment may include a substrate 21, and a first conductivity-type semiconductor layer 24, an active layer 25, and a second conductivity-type semiconductor layer 26 sequentially disposed on the substrate 21. A buffer layer 22 may be disposed between the substrate 21 and the first conductivity-type semiconductor layer 24.

The substrate 21 may be an insulating substrate formed of a material such as sapphire, but is not limited thereto. Thus, the substrate 21 may also be a conductive substrate or a semiconductor substrate in addition to being an insulating substrate. For example, the substrate 21 may be a SiC substrate, a Si substrate, a $MgAl_2O_4$ substrate, a MgO substrate, a $LiAlO_2$ substrate, a $LiGaO_2$ substrate, or a GaN substrate, in addition to being the sapphire substrate. A corrugation (P) may be formed in the upper surface of the substrate 21. The corrugation (P) may improve the quality of grown single crystal while improving light extraction efficiency.

The buffer layer 22 may be an $In_xAl_yGa_{1-x-y}N$ layer ($0 \leq x \leq 1$, $0 \leq y \leq 1$). For example, the buffer layer 22 may be one of a GaN layer, an AlN layer, an AlGaN layer, or an InGaN layer. The buffer layer 22 may be used by combining a plurality of layers or progressively modifying the composition as needed.

The first conductivity-type semiconductor layer 24 may be a nitride semiconductor satisfying n-type $In_xAl_yGa_{1-x-y}N$ ($0 \leq x < 1$, $0 \leq y < 1$, $0 \leq x+y < 1$), and an n-type impurity may be Si. For example, the first conductivity-type semiconductor layer 24 may include an n-type GaN. The second conductivity-type semiconductor layer 26 may be a nitride semiconductor layer satisfying p-type $In_xAl_yGa_{1-x-y}N$ ($0 \leq x < 1$, $0 \leq y < 1$, $0 \leq x+y < 1$), and p-type impurity may be Mg. For example, although the second conductivity-type semiconductor layer 26 may be implemented as a single-layer structure, as in the exemplary embodiment, the second conductivity-type semiconductor layer 26 may have a multilayer structure in which layers have different compositions with respect to one another. The active layer 25 may have a multiple quantum well (MQW) structure formed by a quantum well layer and a quantum barrier layer stacked alternately with each other. For example, the quantum well layer and the quantum barrier layer may be $In_xAl_yGa_{1-x-y}N$ ($0 \leq x \leq 1$, $0 \leq y \leq 1$, $0 \leq x+y \leq 1$) layers having different compositions. In certain exemplary embodiments, the quantum well layer may be provided as an $In_xGa_{1-x}N$ ($0 < x \leq 1$) layer, and the quantum barrier layer may be a GaN layer or an AlGaN layer. The thickness of the quantum well layer and the quantum barrier layer may each be within a range of 1 nm to 50 nm. The active layer 25 is not limited to a multiple quantum well structure, but may also have a single quantum well structure.

The first and second electrodes 29a and 29b may be disposed on a mesa etched region of the first conductivity-type semiconductor layer 24 and the second conductivity-type semiconductor layer 26, respectively, to be located on the same surface (the first surface). The first electrode 29a may contain a material such as Ag, Ni, Al, Cr, Rh, Pd, Ir, Ru, Mg, Zn, Pt, and Au, but is not limited to such materials, and may have a single-layer structure or a structure of two or more layers. The second electrode 29b may be configured of a transparent electrode formed using a material such as a transparent conductive oxide or a transparent conductive nitride, and may include graphene as necessary. The second electrode 29b may include at least one of Al, Au, Cr, Ni, Ti, and Sn.

A wavelength conversion film 38 may be disposed on the upper surface, for example, the second surface, of the semiconductor LED chip 20 mounted on the package substrate 10. The wavelength conversion film 38 may include a wavelength conversion material converting a portion of light emitted from the semiconductor LED chip 20 to light having a different wavelength. The wavelength conversion film 38 may be provided as a resin layer in which the wavelength conversion material is dispersed, or a ceramic film including a sintered body of a ceramic phosphor. The semiconductor LED chip 20 may emit blue light, and the wavelength conversion film 38 may emit white light by converting a portion of the blue light to yellow and/or red and green light, such that the semiconductor light emitting device 30 according to the exemplary embodiment may be provided. The wavelength conversion materials that may be used in the present exemplary embodiment will be described later (see Table 1 below).

The wavelength conversion film 38 may have an area greater than that of the semiconductor LED chip 20. As illustrated in FIG. 2, the wavelength conversion film 38 may be disposed to cover the second surface of the semiconductor LED chip 20.

In the exemplary embodiment, a side surface inclined portion 34 may be disposed on side surfaces of the semiconductor LED chip 20. The side surface inclined portion 34 may improve light extraction efficiency by reducing total internal reflection on the side surface of the semiconductor LED chip 20 by providing an inclined surface to be suitable for light extraction. Such inclined surfaces may be formed to face the package substrate 10. For example, as illustrated in FIG. 1, the width of the side surface inclined portion 34 may become greater toward the wavelength conversion film 38.

The side surface inclined portion 34 may have an inclination angle of around 45° or less with respect to the side surface of the semiconductor LED chip 20. However, the inventive concept may not be limited to the above structure of the side surface inclined portion 34. That is, as long as the light extraction efficiency is improved and light emitted from the semiconductor LED chip 20 (e.g., light emitted from the side surfaces of the semiconductor LED chip 20) can be guided toward the wavelength conversion film 38, the side surface inclined portion 34 does not need to have inclined side surfaces.

The side surface inclined portion 34 employed in the exemplary embodiment may include a light-transmitting resin containing a wavelength conversion material. For example, the light-transmitting resin may be a silicone resin. A refractive index of the silicone resin may be selected from within a range of 1.38 to 1.8. The wavelength conversion material contained in the light-transmitting resin of the side surface inclined portion 34 may include a material identical to the wavelength conversion material contained in the wavelength conversion film 38, but is not limited thereto. Thus, the wavelength conversion material may also be provided as a wavelength conversion material for obtaining light having a different wavelength. For example, the wavelength conversion film 38 may include a yellow phosphor, and the side surface inclined portion 34 may include at least one of a red phosphor or a green phosphor to enhance color rendering properties (Ra).

As illustrated in FIG. 1 and FIG. 2, a side surface reflection portion 36 surrounding the side surface inclined portion 34 may be disposed below the wavelength conversion film 38. An interface of the side surface inclined portion 34 and the side surface reflection portion 36 may serve as a reflective surface, and the inclined surface according to the exemplary embodiment may provide a structure suitable for guiding light toward the wavelength conversion film 38. The side surface reflection portion 36 may include a light-transmitting resin containing a reflective powder. The reflective powder may be a white ceramic powder or a metal powder. For example, the ceramic powder may be a powder of at least one selected from a group consisting of $TiO_2$, $Al_2O_3$, $Nb_2O_5$, $Al_2O_3$, and ZnO. The metal powder may be formed of a material such as Al or Ag.

Unlike the present exemplary embodiment, the semiconductor light-emitting device 30 may not be provided with the side surface reflection portion 36, but may be configured to emit light through the side surfaces of the semiconductor LED chip 20.

In the exemplary embodiment, a light-transmitting adhesive layer 32 may be disposed between the wavelength conversion film 38 and the semiconductor LED chip 20 to allow the wavelength conversion film 38 to be bonded to the second surface of the semiconductor LED chip 20. In this case, the light-transmitting adhesive layer 32 may include the same material as the side surface inclined portion 34. For example, the light-transmitting adhesive layer 32 and the side surface inclined portion 34 may be formed of the same material, a silicone resin containing a yellow phosphor. The side surface inclined portion 34 may be formed of the same material as the light-transmitting adhesive layer 32 in the bonding process of the wavelength conversion film 38 and the semiconductor LED chip 20 using the light-transmitting adhesive layer 32 (see FIG. 5C).

In addition to providing an inclined surface suitable for light extraction, the side surface inclined portion 34 employed in the exemplary embodiment may contain a wavelength conversion material such as a phosphor to allow for wavelength conversion of light entering the side surface inclined portion 34. Furthermore, light loss due to total internal reflection may also be reduced to improve light extraction efficiency.

Figure 4:
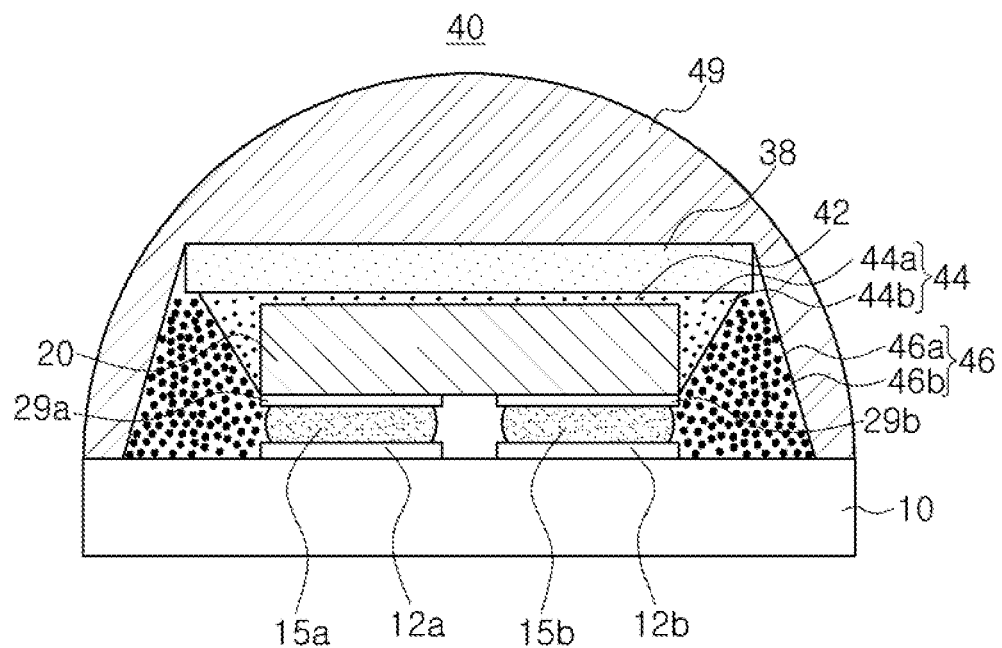
FIG. 4 is a cross-sectional view illustrating a semiconductor light-emitting device according to an exemplary embodiment.

FIG. 4 is a cross-sectional view illustrating a semiconductor light-emitting device according to an exemplary embodiment.

Referring to FIG. 4, the semiconductor light-emitting device 40 according to the exemplary embodiment may include a package substrate 10 having a mounting surface, and a semiconductor LED chip 20 bonded to the mounting surface of the package substrate 10 in a flip chip manner, similar to the exemplary embodiments above.

In the exemplary embodiment, a wavelength conversion film 38 may be disposed to cover the second surface of the semiconductor LED chip 20. The wavelength conversion film 38 may have an area greater than that of the semiconductor LED chip 20. A side surface inclined portion 44 disposed on side surfaces of the semiconductor LED chip 20 may provide an inclined surface suitable for light extraction similar to the side surface inclined portion 34 of the previous exemplary embodiment, but may include a light dispersing material 44a instead of the wavelength conversion material. In detail, the side surface inclined portion 44 may be formed of a light-transmitting resin 44b containing a light dispersing material 44a. The light dispersing material 44a may be a particle having a different refractive index from the light-transmitting resin 44b, for example, at least one of $SiO_2$ (n=1.45), $TiO_2$ (n=1.48), and $Al_2O_3$ (n=2.73). The light-transmitting resin 44b may be formed of silicone, an epoxy, or a combination thereof, but is not limited thereto.

In the exemplary embodiment, a light-transmitting adhesive layer 42 may bond the wavelength conversion film 38 to the second side of the semiconductor LED chip 20. The light-transmitting adhesive layer 42 may be formed of a light-transmitting resin identical to the light-transmitting resin 44b included in the side surface inclined portion 44 which contains the light dispersing material 44a. For example, the light-transmitting adhesive layer 42 and the side surface inclined portion 44 may be formed of a silicone resin containing silica ($SiO_2$) powder as the light dispersing material 44a.

As illustrated in FIG. 4, a side surface reflection portion 46 surrounding the side surface of the side surface inclined portion 44 may be disposed below the wavelength conversion film 38. The side surface reflection portion 46 may be formed of a light-transmitting resin 46b containing reflective powder 46a. The reflective powder 46a may be a white ceramic powder or a metal powder. The semiconductor light-emitting device 40 may further include an optical lens 49 disposed over the wavelength conversion film 38. The optical lens 49 may be formed of a resin material having light transmissive properties, for example, polycarbonate (PC), polymethyl methacrylate (PMMA), an acrylic resin, or the like, or may also be formed of a glass material.

In addition to providing an inclined surface suitable for light extraction, the side surface inclined portion 44 employed in the exemplary embodiment may contain a light dispersing material to allow scattering of light entering the side surface inclined portion 44. As a result, a reduced color deviation effect may be obtained along with improved luminous efficiency. Furthermore, an increase in luminous efficiency and a decrease in color deviation may differ somewhat, according to a difference in refractive indexes of the light dispersing material 44a and the light-transmitting resin 44b. For example, in the case of a great difference in the refractive index, color deviation may be further decreased, and in the case of a small difference in the refractive index, luminous efficiency may be further increased.

FIG. 5A to FIG. 5D are cross-sectional views illustrating a process of manufacturing the semiconductor light-emitting device.

Figure 5A:
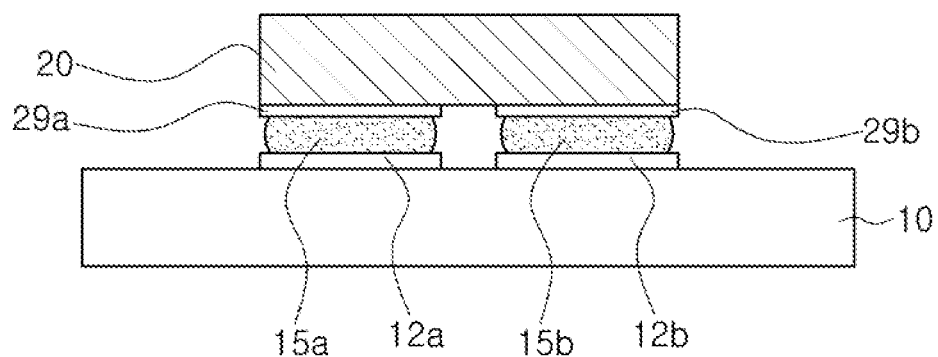
FIG. 5A to FIG. 5D are cross-sectional views illustrating a manufacturing process of the semiconductor light-emitting device.

As illustrated in FIG. 5A, the semiconductor LED chip 20 may be mounted above the package substrate 10.

The semiconductor LED chip 20 may have a flip chip structure in which the first surface is mounted to face the mounting surface. The semiconductor LED chip 20 may have a first surface on which first and second electrodes 29a and 29b are disposed, a second surface opposing the first surface, and side surfaces connecting the first surface and the second surface, and the package substrate 10 may include first and second circuit patterns 12a and 12b disposed on the mounting surface. The first and second electrodes 29a and 29b may be connected to the first and second circuit patterns 12a and 12b, respectively, using solder balls 15a and 15b.

Figure 5B:
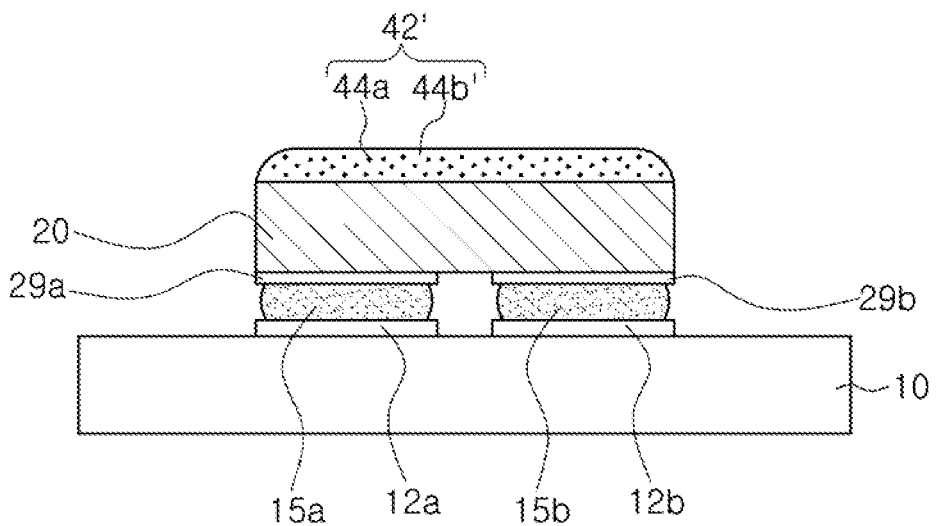

As illustrated in FIG. 5B, a bonding resin 42' may be disposed on the second surface of the semiconductor LED chip 20.

The bonding resin 42' may be a curable liquid resin 44b' mixed with a light dispersing material 44a in a powder form. At least one of $SiO_2$, $TiO_2$, and $Al_2O_3$ may be used as the light dispersing material 44a. The curable liquid resin 44b' may be a resin formed of silicone, epoxy, or a combination thereof, but is not limited thereto. In the bonding process, the bonding resin 42' may be dripped in an amount greater than that required for bonding. In detail, a portion of the bonding resin 42' may flow along the side surface of the semiconductor LED chip 20 in a subsequent bonding process to provide an amount of resin sufficient to be provided as a side surface inclined portion (44 in FIG. 5C). In addition, by controlling the viscosity of the bonding resin 42', the flowing portion thereof may form an inclined surface which may be maintained on the side surface of the semiconductor LED chip 20 until curing for a certain period of time.

Figure 5C:
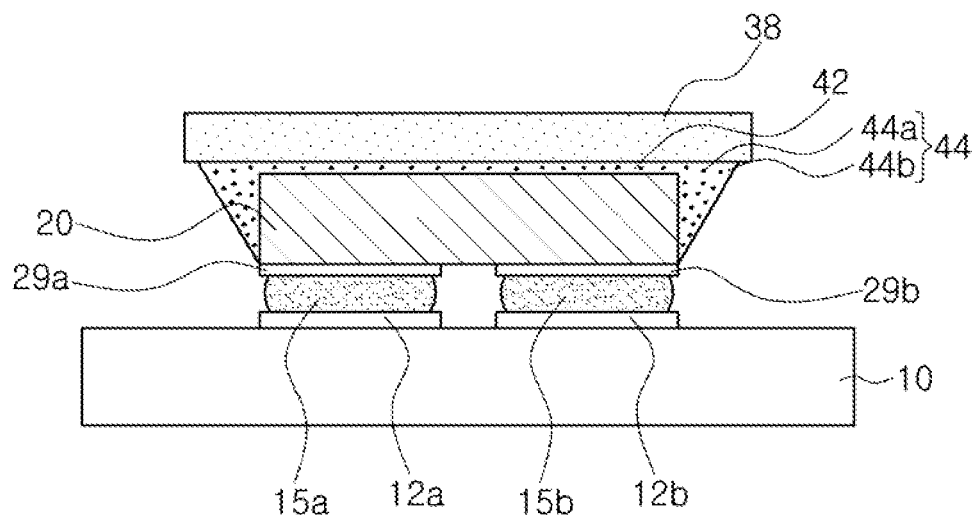

FIG. 5C illustrates a state in which the wavelength conversion film 38 is bonded to the second surface of the semiconductor LED chip 20 by the light-transmitting adhesive layer 42 after curing. This state may be obtained by curing the bonding resin 42'. In the process of disposing the wavelength conversion film 38 on the semiconductor LED chip 20, a portion of the bonding resin 42' may flow along the side surface of the semiconductor LED chip 20 in an inclined form, and by curing the bonding resin 42' so that the inclined shape of the flow may be maintained, the side surface inclined portion 44 may be formed together with the light-transmitting adhesive layer 42. As a result, the side surface inclined portion 44 employed in the exemplary embodiment may be formed of the same material as the light-transmitting adhesive layer 42. According to the present process, the side surface inclined portion 44 may improve light extraction efficiency by reducing total internal reflection on the side surface of the semiconductor LED chip 20 by providing an inclined surface suitable for light extraction.

Figure 5D:
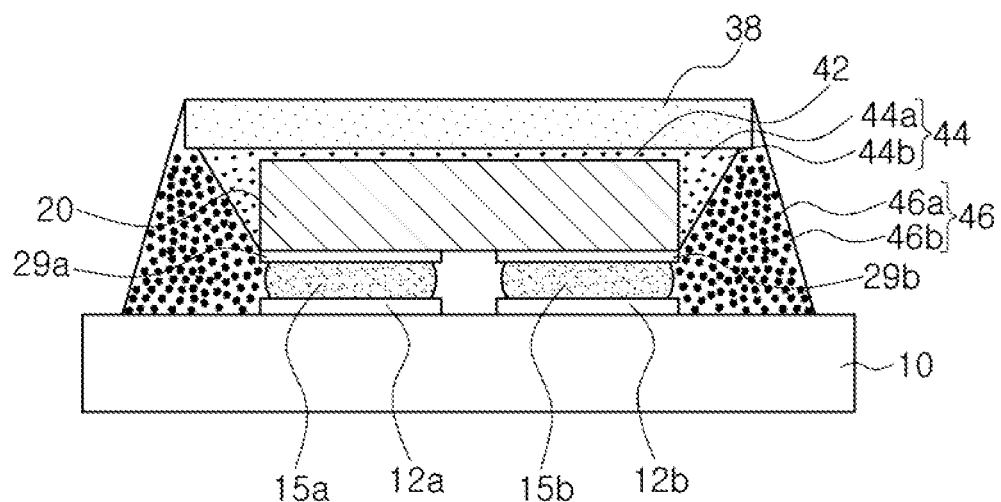

As illustrated in FIG. 5D, a side surface reflection portion 46 may be formed on the package substrate 10 to surround the side surface inclined portion 44.

The interface of the side surface reflection portion 46 and the side surface inclined portion 44 may be provided as a reflective surface for guiding light toward the wavelength conversion film 38. The side surface reflection portion 46 may be formed of a light-transmitting resin containing a reflective powder. The reflective powder may be a white ceramic powder or a metal powder. For example, the ceramic powder may be at least one selected from a group consisting of $TiO_2$, $Al_2O_3$, $Nb_2O_5$, $Al_2O_3$, and ZnO. The metal powder may be a metal powder such as an Al or Ag powder.

Further, an optical lens 49 may be additionally formed as necessary such that the semiconductor light-emitting device illustrated in FIG. 4 may be obtained. The optical lens 49 may be formed by a method of injecting a liquid solvent into a mold and curing it. For example, the optical lens 49 may be formed by a method such as injection molding, transfer molding, or a compression molding.

In the exemplary embodiment, the bonding resin 42 is illustrated as containing a light dispersing material 44a, however, unlike such a configuration, the bonding resin may be configured to contain a wavelength conversion material such as a phosphor powder to form a side surface inclined portion containing a wavelength conversion material together with a light-transmitting adhesive layer.

Figure 6:
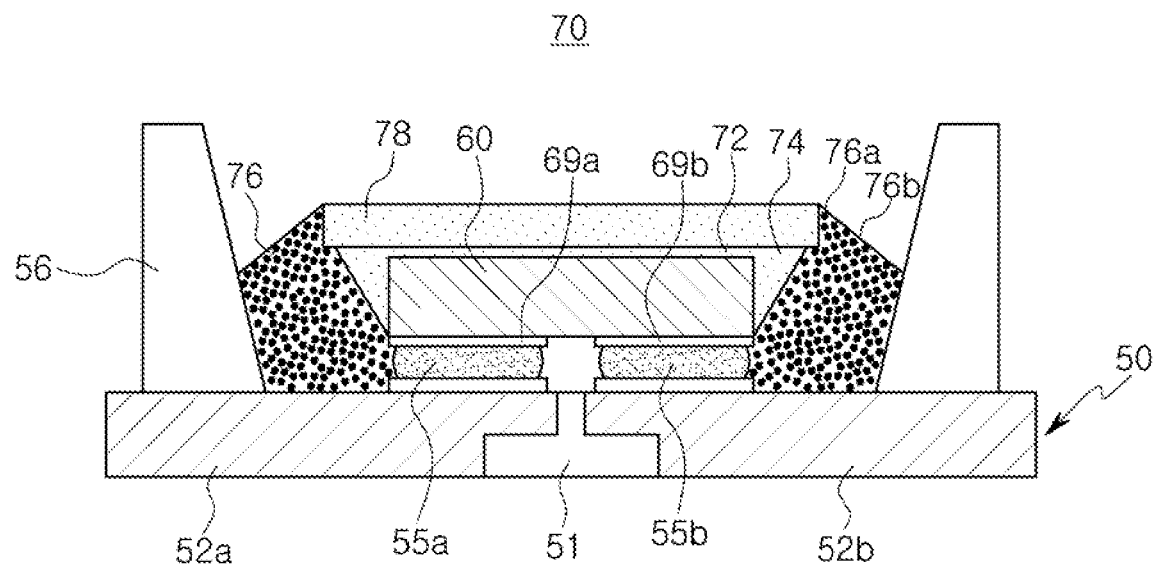
FIG. 6 is a cross-sectional view illustrating a semiconductor light-emitting device according to an exemplary embodiment.

FIG. 6 is a cross-sectional view illustrating a semiconductor light-emitting device according to an exemplary embodiment.

A semiconductor light-emitting device 70 illustrated in FIG. 6 may include a package substrate 50 having a mounting surface, and a semiconductor LED chip 60 bonded to the mounting surface of the package substrate 50 in a flip chip manner, similar to the foregoing exemplary embodiment.

The package substrate may be a structure in which lead frames of the first and second circuit patterns 52a and 52b are bonded by an insulating resin portion 51. The package substrate 50 may be disposed on the mounting surface, and may further include a reflective structure 56 formed to surround the semiconductor LED chip 60. The reflective structure 56 may be cup-shaped with an inclined inner surface.

In the exemplary embodiment, a wavelength conversion film 78 may be disposed to cover the second surface of the semiconductor LED chip 60. The wavelength conversion film 78 may have an area greater than that of the semiconductor LED chip 60. A side surface inclined portion 74 disposed on a side of the semiconductor LED chip 60 may have an inclined surface suitable for light extraction. The side surface inclined portion 74 may be formed of a light-transmitting resin containing a wavelength conversion material, such as the exemplary embodiment illustrated in FIG. 1. Alternatively, the side surface inclined portion 74 may be formed of a light-transmitting resin containing a light dispersing material.

The light-transmitting adhesive layer 72 may bond the wavelength conversion film 78 to the second surface of the semiconductor LED chip 60. The light-transmitting adhesive layer 72 may include a light-transmitting resin containing a wavelength conversion material identical to that of the wavelength conversion film 78.

In the exemplary embodiment, the side surface reflection portion 76 may be formed to surround the side surface inclined portion 74 within the reflective structure 56 having a cup shape. The side surface reflection portion 76 located below the wavelength conversion film 78 may be formed of a light-transmitting resin 76b containing a reflective powder 76a. The reflective powder 76a may be a white ceramic powder or a metal powder.

In addition to providing an inclined surface suitable for light extraction, the side surface inclined portion 74 employed in the exemplary embodiment may contain a wavelength conversion material such as a phosphor to allow for the scattering of light entering the side surface inclined portion 74. As a result, a color deviation reduction effect may be obtained along with improved light extraction efficiency.

Figure 7:
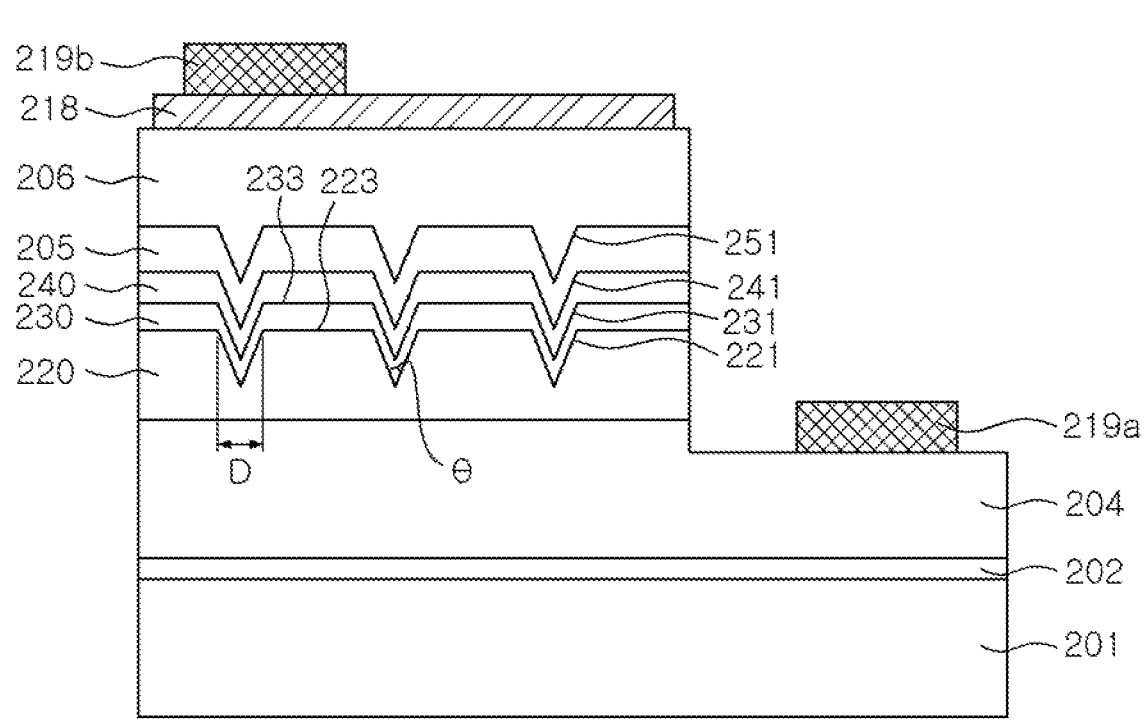

A semiconductor LED chip that may be employed in the exemplary embodiment is not limited to the structure illustrated in FIG. 3, and chips having a variety of structures capable of being flip-chip bonded may be employed. FIG. 7 and FIG. 8 are cross-sectional views illustrating various examples of the semiconductor LED chip which may be employed in the semiconductor light-emitting device according to an exemplary embodiment.

The semiconductor LED chip 200 illustrated in FIG. 7 may include a substrate 201, and a first conductivity-type semiconductor layer 204, an active layer 205, and a second conductivity-type semiconductor layer 206 disposed sequentially on the substrate 201. A buffer layer 202 may be disposed between the substrate 201 and the first conductivity-type semiconductor layer 204.

The substrate 201 may be an insulating substrate formed of a material such as sapphire but is not limited thereto, and the substrate 201 may be also be a conductive substrate or a semiconductor substrate in addition to being an insulating substrate. The buffer layer 202 may be an $In_xAl_yGa_{1-x-y}N$ ($0 \le x \le 1$, $0 \le y \le 1$) layer. For example, the buffer layer 202 may be a GaN layer, an AlN layer, an AlGaN layer, or an InGaN layer. A thickness of the buffer layer 202 may be within a range of 0.1 nm to 500 nm. Materials such as $ZrB_2$, $HfB_2$, ZrN, HfN, and TiN may be used as necessary. In a detailed exemplary embodiment, the buffer layer 202 may be used by combining a plurality of layers, or by progressively modifying a composition thereof.

Although the first and second conductivity-type semiconductor layers 204 and 206 may be formed of a single layer structure, alternatively, the semiconductor layers may have a multilayer structure having different compositions or thicknesses, and the like, as required. For example, the first and second conductivity-type semiconductor layers 204 and 206 may be provided with a carrier injection layer improving injection efficiency of electrons and/or holes in at least one layer of the first and second conductivity-type semiconductor layers 204 and 206. Further, a superlattice structure having various forms may also be provided therein.

The semiconductor LED chip 200 according to the exemplary embodiment may further include a V-pit generation layer 220 formed on an upper portion of the first conductivity-type semiconductor layer 204. The V-pit generation layer 220 may be adjacent to the first conductivity-type semiconductor layer 204. The V-pit generation layer 220 may have a V-pit density of, for example, approximately $1 \times 10^8$ cm$^{-2}$ to approximately $5 \times 10^9$ cm$^{-2}$. According to exemplary embodiments, the V-pit generation layer 220 may have a thickness of approximately 200 nm to approximately 800 nm. In addition, a width (D) of an inlet of a V-pit 221 may be approximately 200 nm to approximately 800 nm.

A V-pit 221 generated in the V-pit generation layer 220 may have an apex angle (θ) of around 10° to 90°, for example, 20° to 80°. In other words, when it is assumed that the V-pit 221 is to be viewed as a cross section on a vertical plane passing through a vertex of the V-pit 221, an angle formed by the two inclined surfaces of the V-pit 221, meeting at the vertex, may be between 10° to 90°.

The V-pit 221 generated in the exemplary embodiment may have a growth surface ((0001) plane) parallel to a substrate surface, and inclined growth surfaces ((1-101) plane) and ((11-22) plane), or other inclined crystal surfaces, inclined with respect to the substrate surface. Such a V-pit 221 may be formed around a penetrating potential penetrating a light-emitting structure to prevent a phenomenon of current being concentrated on the penetrating potential.

In an exemplary embodiment, the V-pit generation layer 220 may be a GaN layer or an impurity-doped GaN layer.

A location in which the V-pit 221 is generated in the V-pit generation layer 220 may be controlled by a growth temperature. For example, in a case in which the growth temperature is relatively low, the generation of the V-pit 221 may be initiated from a lower position. In addition, in a case in which the growth temperature is relatively high, the generation of V-pit 221 may be initiated in a higher position. Given that the V-pit generation layer 220 is of the same height, in a case in which the generation of the V-pit 221 is initiated in a lower position, a width of the upper portion of the V-pit 221 may be further increased.

A film enhancement layer 230 may be provided in the upper portion of the V-pit generation layer 220. The film enhancement layer 230 may have a composition of $M_xGa_{1-x}N$. Here, M may be Al or In, and may satisfy $0.01 \le x \le 0.3$. In some exemplary embodiments, the composition may satisfy a range of $0.02 \le x \le 0.08$. In a case in which the value of x is relatively too low, the effect of film enhancement may be insufficient. In contrast, in a case in which the value of x is relatively too high, high luminescence properties may be decreased. The value of x within the film enhancement layer 230 may be constant. Optionally, the film enhancement layer 230 may have a multilayer structure in which the GaN layer and the MxGa1-xN layers (wherein M is Al or In, and x satisfies $0.01 \le x \le 0.3$) are layered alternately. Moreover, the film enhancement layer 230 may be a superlattice layer of GaN and MxGa1-xN (wherein M is Al or In, and x satisfies $0.01 \le x \le 0.3$). A thickness of the film enhancement layer 230 may be approximately 20 nm to approximately 100 nm.

The film enhancement layer 230 may be formed on the entire upper surface of the V-pit generation layer 220. In addition, the film enhancement layer 230 may have a substantially constant thickness in a vertical direction with respect to the upper surface of the V-pit generation layer 220.

The film enhancement layer 230 may fill the V-pit 221 at least partially by covering the inside of the V-pit 221 of the V-pit generation layer 220 to a predetermined thickness. A V-pit 231 of the film enhancement layer 230 may be recessed into the V-pit 221 of the V-pit generation layer 220. The thickness of the film enhancement layer 230 in a vertical direction with respect to the surface of the upper portion of the V-pit generation layer 220 may be approximately 5% to approximately 20% of the thickness of the V-pit generation layer 220.

The V-pit 231 formed in the film enhancement layer 230 may have a dimension identical or similar to that of the V-pit 221 of the V-pit generation layer 220.

In addition, an upper surface 233 of the film enhancement layer 230 may have enhanced surface roughness compared to an upper surface 223 of the V-pit generation layer 220. For example, the surface roughness of the upper surface 233 of the film enhancement layer 230 may be 60% or less of the surface roughness of the upper surface 223 of the V-pit generation layer 220. Such surface roughness may be measured with an atomic force microscope (AFM). In addition, the surface roughness may be based on measurement of an upper surface excluding the V-pits 221 and 231. In addition, the surface roughness may be determined by measuring the uniformity (flatness) of an interface. For example, the uniformity of the film enhancement layer 230 and an interface adjacent thereto may be superior to the uniformity of the V-pit generation layer 220 and an interface adjacent thereto.

Therefore, by enhancing the surface roughness of the upper surface 233 of the film enhancement layer 230, the surface roughness of a barrier layer and a quantum well layer within the active layer 205 disposed thereabove may both be enhanced. As a result, luminescence may be significantly improved since non-light-emitting recombination of electrons and holes may be reduced.

The semiconductor LED chip 200 may further include a superlattice layer 240 adjacent to the active layer 205 above the first conductivity-type semiconductor layer 204. The superlattice layer 240 may have a structure in which a plurality of $In_xAl_yGa_{(1-xy)}N$ layers (here, 0≤x<1, 0≤y<1, 0≤x+y<1)) having different compositions or impurity contents with respect to each other are stacked repeatedly, or an insulating material layer is partially formed therein. The superlattice layer 240 may facilitate uniform luminescence across a large area by promoting current diffusion.

A V-pit 241 corresponding to the V-pit 231 formed in the film enhancement layer 230 may also be formed in the superlattice layer 240.

The superlattice layer 240 may fill the V-pit 231 at least partially by covering the inside of the V-pit 231 of the film enhancement layer 230 to a predetermined thickness. The V-pit 241 of the superlattice layer 240 may be recessed into the V-pit 231 of the film enhancement layer 230.

A V-pit 251 corresponding to the V-pit 241 formed in the superlattice layer 240 may also be formed in the active layer 250.

Like the superlattice layer 240, the active layer 250 may fill the V-pit 241 at least partially by covering the inside of the V-pit 241 of the superlattice layer 240 to a predetermined thickness. The V-pit 251 of the active layer 250 may be recessed into the V-pit 241 of the superlattice layer 240.

The second conductivity-type semiconductor layer 206 may further include an electron blocking layer disposed to be adjacent to the active layer 205. The electron blocking layer (EBL) may have a structure in which a plurality of $In_xAl_yGa_{(1-xy)}N$ layers having different compositions with respect to each other are layered, or one or more layers including $Al_yGa_{(1-y)}N$. The electron blocking layer having a band gap wider than that of the active layer 205 may prevent electrons from moving to the second conductivity-type (p-type) semiconductor layer 206.

A valley of the V-shape of a V-pit formed in the V-pit generation layer 220, the film enhancement layer 230, the superlattice layer 240, or the active layer 250 may become gentle gradually in the thickness direction of each layer, for example, the closer to the second conductivity-type semiconductor layer 206, the more flattened the V-pit may become by the active layer 250 or the second conductivity-type semiconductor layer 206.

The semiconductor LED chip 200 may include a first electrode 219a disposed on the first conductivity-type semiconductor layer 204, and an ohmic contact layer 218 and a second electrode 219b disposed sequentially on the second conductivity-type semiconductor layer 206.

FIG. 8 is a side cross-sectional view illustrating an example of a semiconductor LED chip which may be employed in the present inventive concept.

Referring to FIG. 8, a semiconductor LED chip 400 may include a semiconductor laminate S formed on a substrate 401. The semiconductor laminate S may include a first conductivity-type semiconductor layer 414, an active layer 415, and a second conductivity-type semiconductor layer 416.

The semiconductor LED chip 400 may include first and second electrodes 422 and 424 connected to the first and second conductivity-type semiconductor layers 414 and 416, respectively. The first electrode 422 may include a connecting electrode portion 422a penetrating through the second conductivity-type semiconductor layer 416 and the active layer 415 so as to be connected to the first conductivity-type semiconductor layer 414, similar to the conductive via, and a first electrode pad 422b connected to the connecting electrode portion 422a. The connecting electrode portion 422a may be surrounded by an insulating portion 421 to be electrically isolated from the active layer 415 and the second conductivity-type semiconductor layer 416. The connecting electrode portion 422a may be disposed on a region in which the semiconductor laminate (S) is etched. The number, a shape, a pitch, a contact area with the first conductivity-type semiconductor layer 414, and the like, of the connecting electrode portion 422a may be appropriately designed to lower contact resistance. In addition, the connecting electrode portion 422a may improve current flow by being arranged to form rows and columns on the semiconductor laminate 410. The second electrode 424 may include an ohmic contact layer 424a on the second conductivity-type semiconductor layer 416 and a second electrode pad 424b.

The connecting electrode portion 422a and the ohmic contact layer 424a may have a conductive material having ohmic contact with first and second conductivity type semiconductor layers 414 and 416, respectively, and may have a single layer or multilayer structure thereof. For example, the connecting electrode portion 422a and the ohmic contact layer 424a may be formed by depositing or sputtering one or more materials, such as Ag, Al, Ni, Cr, a transparent conductive oxide (TCO), and the like.

The first and second electrode pads 422b and 424b may be respectively connected to the connecting electrode portion 422a and the ohmic contact layer 424a to serve as external terminals of the semiconductor light-emitting diode 400. For example, the first and second electrode pads 422b and 424b may be Au, Ag, Al, Ti, W, Cu, Sn, Ni, Pt, Cr, NiSn, TiW, AuSn, or a eutectic metal of such elements.

The first and second electrodes 422 and 424 may be arranged in the same direction as each other, and may be mounted in the form of a flip chip on a lead frame and the like.

The two electrodes 422 and 424 may be electrically isolated from each other by the insulating portion 421. Although as a material of the insulating portion 421, any material having electrically insulating properties may be used, and any object having electrically insulating properties may be employed, a material having relatively low light absorption may be used. For example, a silicon oxide and silicon nitride such as $SiO_2$, $SiO_xN_y$, and $Si_xN_y$ may be used. A light reflecting structure may be formed as necessary by dispersing a light-reflective filler in a light-transmitting material. Unlike that, the insulating unit 421 may have a multilayer reflective structure in which a plurality of insulating films having different refractive indices with respect to each other are alternately stacked. For example, such a multilayer structure may be provided as a distributed Bragg reflector (DBR) in which a first insulating film having a first refractive index and a second insulating film having a second refractive index are alternately stacked.

The multilayer reflective structure may be a structure in which a plurality of insulating films having different refractive indices with respect to one another are stacked repeatedly two to one hundred times. For example, the insulating films may be stacked repeatedly three to seventy times, and in detail, four to fifty times. The plurality of insulating films of the multilayer reflective structure may, respectively, be an oxide or a nitride such as $SiO_2$, SiN, $SiO_xN_y$, $TiO_2$, $Si_3N_4$, $Al_2O_3$, TiN, AlN, $ZrO_2$, TiAlN, TiSiN, and combinations thereof. For example, given that λ is a wavelength of light generated in the active layer and n is a refractive index of a corresponding layer, the first insulating film and the second insulating film may be formed to have a thickness of λ/4n, and may have a thickness of approximately 300 Å to 900 Å. In this case, the multilayer reflective structure may be designed so that a refractive index and a thickness of the first insulating film and the second insulating layer are respectively selected to have a relatively high degree of reflectivity (for example, 95% or more) with respect to the wavelength of light generated in the active layer 415.

The refractive indices of the first insulating film and the second insulating film may be determined to be values within a range of approximately 1.4 to 2.5, and may be values smaller than the refractive index of the first conductivity-type semiconductor layer 404 and the refractive index of the substrate, but may be a value smaller than the refractive index of the first conductivity-type semiconductor layer 404 and greater than the refractive index of the substrate.

FIG. 9A and FIG. 9B are schematic views illustrating various examples of a light source module using the semiconductor light-emitting device according to the exemplary embodiment.

The light source modules illustrated in FIG. 9A and FIG. 9B may include a plurality of light-emitting devices mounted on a circuit board respectively, and the plurality of light-emitting devices may be the semiconductor light-emitting device according to the above-described exemplary embodiment. The plurality of light-emitting devices mounted in a single light source module may be configured as a single package, generating light of the same wavelength, but as in the exemplary embodiment, the devices may be configured as packages of different types generating light of different wavelengths.

Referring to FIG. 9A, a white light source module may be configured by combining white light-emitting devices 30 and 40 having respective color temperatures of 3000K and 4000K, and a red light-emitting device. The white light source module may be adjusted to have a color temperature within a range of 3000K to 4000K, and may provide white light within a range of 85 to 100 color rendering property (Ra).

In another exemplary embodiment, the white light source module may only be configured of a white light-emitting device, but a portion of the package thereof may produce white light of different color temperatures. For example, as illustrated in FIG. 9B, by combining a white light-emitting device 27 having a color temperature of 2700K and a white light-emitting device 50 having a color temperature of 5000K, the color temperature may be adjusted within a range of 2700K to 5000K, and white light having a color rendering property (Ra) within a range of 85 to 99 may be provided. Here, the number of light-emitting devices of each color temperature may be changed, mainly depending on a value of basic color temperature settings. For example, in a case in which a default color temperature value of a lighting device is within a vicinity of 4000K, the number of light-emitting devices corresponding to 4000K may be greater than the number of light-emitting devices corresponding to 3000K or red light-emitting devices.

In this manner, different kinds of light-emitting devices may be configured to include at least one of purple, blue, green, red, or infrared LEDs, and a light source emitting white light by combining yellow, green, red, or orange phosphors with blue LEDs, such that the color temperature and color rendering index (CRI) of white light may be adjusted.

Figure 16:
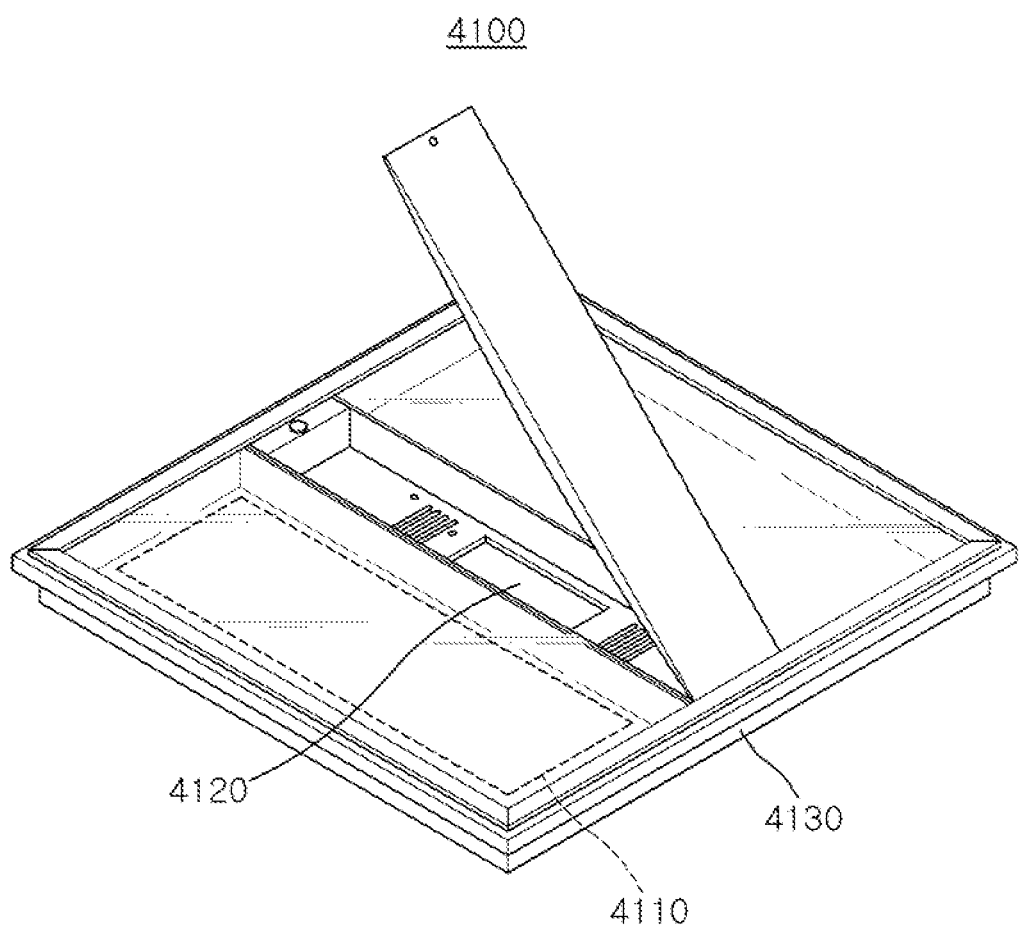
FIG. 16 is an exploded perspective view illustrating a lighting device according to an exemplary embodiment.
Figure 17:
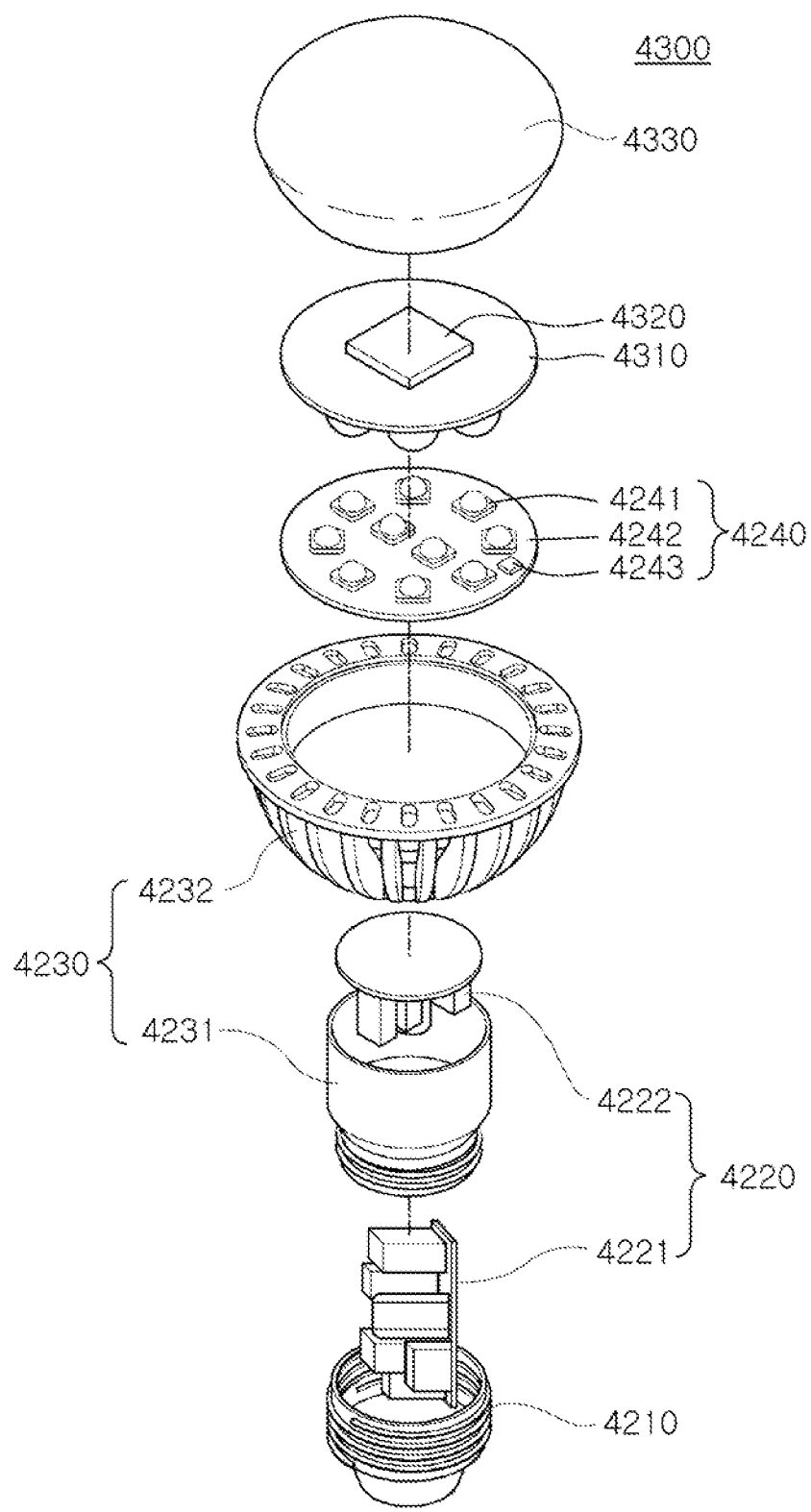
FIG. 17 is an exploded perspective view of a bulb-type lighting device according to an exemplary embodiment.
Figure 18:
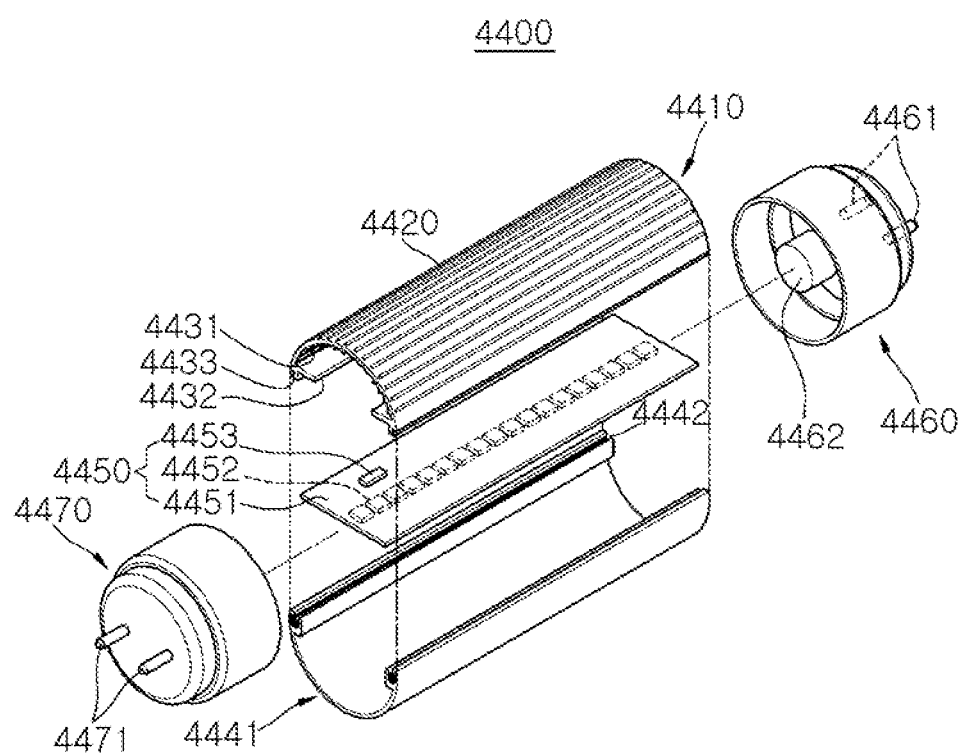
FIG. 18 is an exploded perspective view of a tubular lighting device according to an exemplary embodiment.

The above-described white light source module may be used as a lighting device, for example, the lighting device of FIG. 16 to FIG. 18.

In the semiconductor light-emitting device according to the exemplary embodiment, light having a required color may be determined depending on a wavelength of the LED chip, and the type and blending ratio of a phosphor, and in the case of white light, a color temperature and color rendering index may be controlled. Thereby, the wavelength conversion film used in this exemplary embodiment may be produced.

For example, when the LED chip emits blue light, a light-emitting device including at least one of yellow, green, and red phosphors may be configured to emit white light having a variety of color temperatures depending on the blending ratio of phosphors. In a different manner therefrom, an LED element package in which a green or red phosphor is applied to a blue LED chip may be configured to emit green or red light. In this way, the color temperature and color rendering index of white light may be adjusted by combining an LED element package emitting white light and a package emitting green or red light. Further, at least one of light-emitting diodes emitting purple, blue, green, red, or infrared light may be configured to be included in the lighting device.

In this case, the lighting device may adjust the color rendering index to a daylight level from a level of sodium (Na) light, and may generate a variety of white light having a color temperature level of 20000K increased from 1500K, and may adjust the color of lighting as necessary according to the surrounding atmosphere or the mood by generating violet, blue, green, red, and orange visible light or infrared light. Furthermore, light of a specific wavelength promoting plant growth may also be generated.

Figure 10:
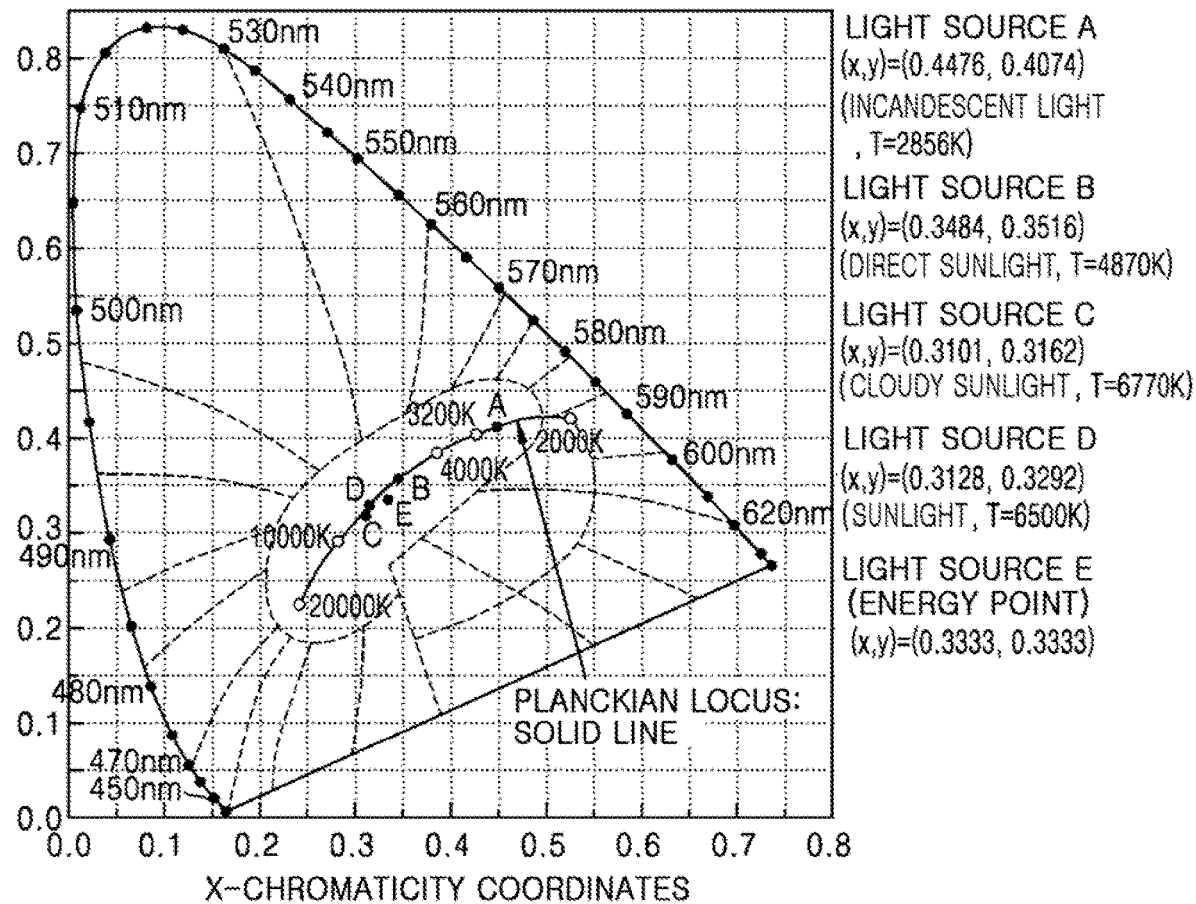
FIG. 10 is a CIE 1931 chromaticity diagram illustrating a wavelength conversion material adaptable to a semiconductor light-emitting device according to an exemplary embodiment.

White light created by combining yellow, green, and red phosphors and/or green and red light-emitting elements with blue light-emitting diodes may have two or more peak wavelengths, and, as illustrated in FIG. 10, the (x, y) coordinates of a CIE 1931 chromaticity diagram may be located within a line segment area connecting (0.4476, 0.4074), (0.3484, 0.3516), (0.3101, 0.3162), (0.3128, 0.3292), and (0.3333, 0.3333), or in an area surrounded by a line segment and a black body radiation spectrum. The color temperature of white light may be between 1500K and 20000K.

A variety of materials, such as a phosphor and/or a quantum dot may be used as a wavelength conversion material for converting a wavelength of light emitted from the semiconductor light-emitting diode.

Phosphors may have the following formula and colors.

Oxides: yellow and green $Y_3Al_5O_{12}$: Ce, $Tb_3Al_5O_{12}$: Ce, $Lu_3Al_5O_{12}$: Ce Silicates: Yellow and Green $(Ba, Sr)_2SiO_4$: Eu, yellow and orange $(Ba, Sr)_3SiO_5$: Ce Nitrides: green β-SiAlON: Eu, yellow $La_3Si_6N_{11}$: Ce, orange α-SiAlON:Eu, red $CaAlSiN_3$: Eu, $Sr_2Si_5N_8$: Eu, $SrSiAl_4N_7$: Eu, $SrLiAl_3N_4$:Eu, $Ln_{4-x}(Eu_zM_{1-z})_xSi_{12-y}Al_yO_{3+x+y}N_{18-xy}$ (0.5≤x≤3, 0<z<0.3, 0<y≤4)—formula (1)

However, Ln in formula (1) may be at least one type of element selected from a group consisting of group IIIa elements and rare earth elements, and M may be at least one type of element selected from a group consisting of Ca, Ba, Sr, and Mg.

Fluorides: KSF-based Red $K_2SiF_6$: $Mn_4^+$, $K_2TiF_6$: $Mn_4^+$, $NaYF_4$: $Mn_4^+$, $NaGdF_4$: $Mn_4^+$ The composition of phosphor may basically coincide with stoichiometry, and respective elements may be substituted with other elements within the respective groups of elements in the periodic table. For example, Sr may be substituted with Ba, Ca, Mg, or the like of an alkaline earth group II element, and Y may be substituted with Tb, Lu, Sc, Gd, or the like of lanthanides. In addition, an activator Eu and the like may be substituted with Ce, Tb, Pr, Er, Yb, and the like, depending on the required energy level, and co-activators and the like may be additionally applied solely to the activator or for a property change.

In detail, individual fluoride-based red phosphors may be coated with a fluoride which does not contain Mn, or may further include an organic coating on a surface of the phosphor or on a fluoride coated surface which does not contain Mn to improve dependability in high temperature/high humidity environments. Since the fluoride-based red phosphor such as the above may implement a narrow full width at half maximum of 40 nm or less, unlike other phosphors, the phosphor may be used in high-definition televisions such as UHD TVs.

The following Table 1 shows the types of phosphors according to fields of application of white light-emitting elements using blue LED chips (440 nm to 460 nm) or UV LED chips (380 nm to 440 nm).

TABLE 1

| Use | Phosphors |
| --- | --- |
| LED TV BLU | β-SiAlON:Eu2+ |
| | (Ca, Sr)AlSiN$_3$:Eu$_2$+ |
| | La$_3$Si$_6$N$_{11}$:Ce3+ |
| | K$_2$SiF$_6$:Mn4+ |
| | SrLiAl3N4:Eu |
| | Ln$_{4-x}$ (EU$_z$M$_{1-zx}$Si$_{12-y}$Al$_y$O$_{3+x+y}$N$_{18-xy}$ (0.5 ≤ x ≤ 3, 0< z < 0.3, 0 < y ≤ 4) |
| | K$_2$TiF$_6$:Mn$_4^+$ |
| | NaYF$_4$:Mn$_4^+$ |
| | NaGdF$_4$:Mn$_4^+$ |
| Side View (Mobile, Note PC) | Lu$_3$Al$_5$O$_{12}$:Ce3+ |
| | Ca-α-SiAlON:Eu2+ |
| | La$_3$Si$_6$N$_{11}$:Ce3+ |
| | (Ca, Sr)AlSiN$_3$:Eu$_2$+ |
| | Y$_3$Al$_5$O$_{12}$:Ce3+ |
| | (Sr, Ba, Ca, Mg)2SiO4:Eu2+ |
| | K$_2$SiF$_6$:Mn4+ |
| | SrLiAl3N4:Eu |
| | Ln$_{4-x}$ (EU$_z$M$_{1-zx}$Si$_{12-y}$Al$_y$O$_{3+x+y}$N$_{18-xy}$ (0.5 ≤ x ≤ 3, 0< z < 0.3, 0 < y ≤ 4) |
| | K$_2$TiF$_6$ :Mn$_4^+$ |
| | NaYF$_4$:Mn$_4^+$ |
| | NaGdF$_4$:Mn$_4^+$ |
| Lighting | Lu$_3$Al$_5$O$_{12}$:Ce3+ |
| | Ca-α-SiAlON:Eu2+ |
| | La$_3$Si$_6$N$_{11}$:Ce3+ |
| | (Ca, Sr)AlSiN$_3$:Eu$_2$+ |
| | Y$_3$Al$_5$O$_{12}$:Ce3+ |
| | K$_2$SiF$_6$:Mn4+ |
| | SrLiAl3N4:Eu |
| | Ln$_{4-x}$ (EU$_z$M$_{1-zx}$Si$_{12-y}$Al$_y$O$_{3+x+y}$N$_{18-xy}$ (0.5 ≤ x ≤ 3, 0< z < 0.3, 0 < y ≤ 4) |
| | K$_2$TiF$_6$:Mn$_4^+$ |
| | NaYF$_4$:Mn$_4^+$ |
| | NaGdF$_4$:Mn$_4^+$ |

TABLE 1-continued

| Use | Phosphors |
| --- | --- |
| Electrical Devices (Head Lamp, etc.) | Lu$_3$Al$_5$O$_{12}$:Ce3+ |
| | Ca-α-SiAlON:Eu2+ |
| | La$_3$Si$_6$N$_{11}$:Ce3+ |
| | (Ca, Sr)AlSiN$_3$:Eu$_2$+ |
| | Y$_3$Al$_5$O$_{12}$:Ce3+ |
| | K$_2$SiF$_6$:Mn4+ |
| | SrLiAl3N4:Eu |
| | Ln$_{4-x}$ (EU$_z$M$_{1-zx}$Si$_{12-y}$Al$_y$O$_{3+x+y}$N$_{18-xy}$ (0.5 ≤ x ≤ 3, 0< z < 0.3, 0 < y ≤ 4) |
| | K$_2$TiF$_6$:Mn$_4^+$ |
| | NaYF$_4$:Mn$_4^+$ |
| | NaGdF$_4$:Mn$_4^+$ |

Further, a wavelength conversion portion may be formed using a wavelength conversion material such as a quantum dot (QD) by substituting a phosphor therewith or by combining the QD with the phosphor.

Figure 11:
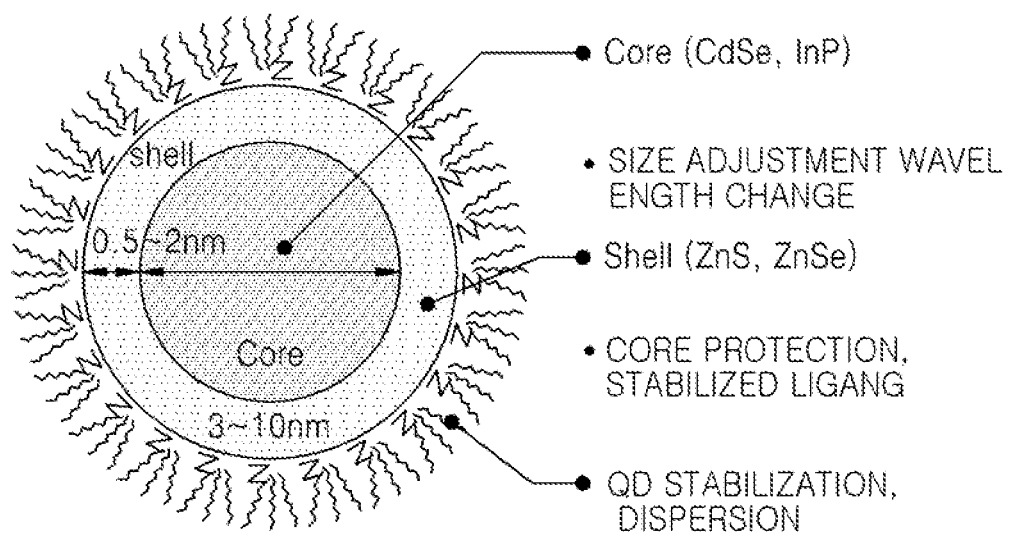
FIG. 11 is a schematic view illustrating a cross-sectional structure of a quantum dot (QD) being used as a wavelength conversion material of the semiconductor light-emitting device according to an exemplary embodiment.

FIG. 11 is a schematic view illustrating a cross sectional structure of a quantum dot (QD) used as a wavelength conversion material according to an exemplary embodiment. The quantum dot (QD) may have a core-shell structure using group III-V or group II-VI compound semiconductors. For example, the quantum dot may have a core formed of a material such as CdSe, InP, or the like and a shell formed of a material such as ZnS, or ZnSe. In addition, the quantum dots may include a ligand for the stabilization of the core and the shell. For example, a diameter of the core may be between 1 nm to 30 nm, or in detail, between 3 nm to 10 nm, and a thickness of the shell may be between 0.1 nm to 20 nm, or in detail, between 0.5 nm to 2 nm.

The quantum dot may implement various colors depending on the size; in detail, in a case in which the quantum dots are used as a substitute material for a phosphor, the quantum dots may be used as red or green phosphors. In a case in which the quantum dots are used, a narrow full width at half maximum of approximately 35 nm may be implemented.

The wavelength conversion material may be prepared in advance as the wavelength conversion film described in the previous exemplary embodiment, and may be used by adhering to the surface of an optical structure such as an LED chip. In this case, the wavelength conversion material may be readily applicable in a structure of a uniform thickness on a required region.

Figure 12:
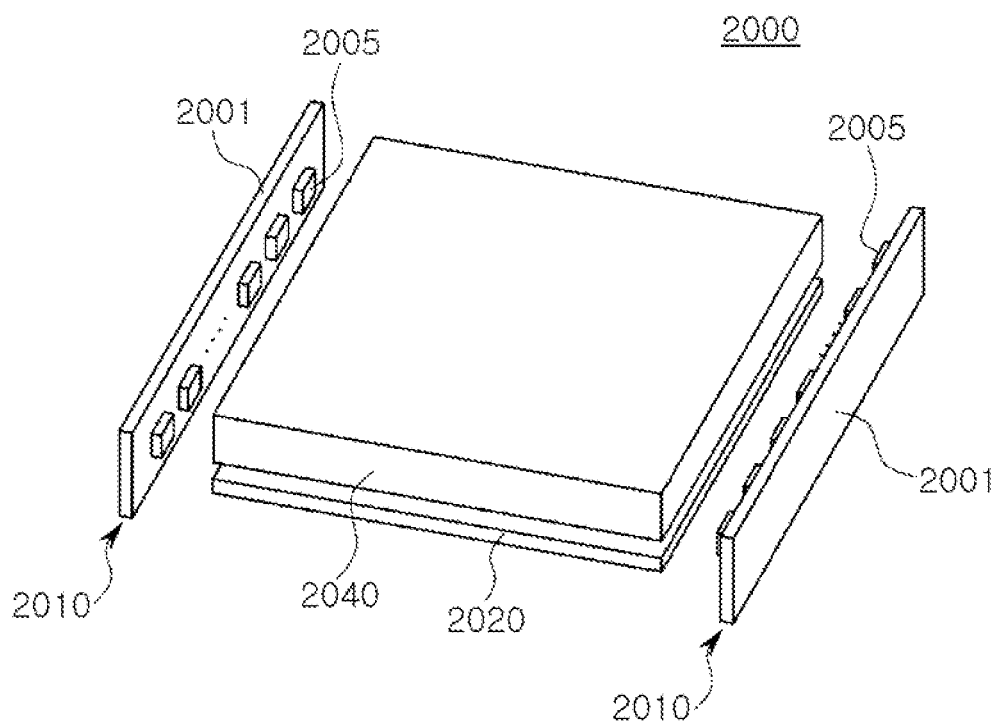
FIG. 12 and FIG. 13 are cross-sectional views illustrating a backlight unit according to various exemplary embodiments.
Figure 13:
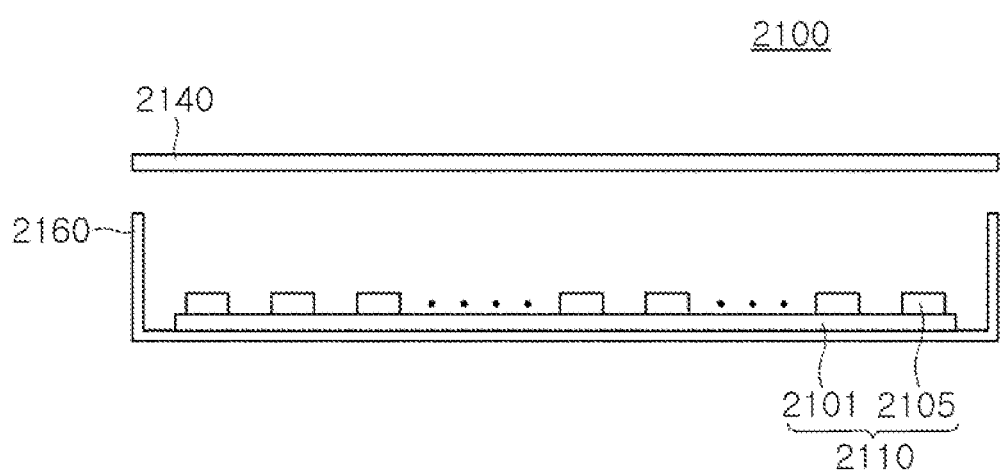

FIG. 12 and FIG. 13 are cross-sectional views illustrating a backlight unit according to various exemplary embodiments.

Referring to FIG. 12, a backlight unit 2000 may include a light guide plate 2040 and light source modules 2010 provided on both sides of the light guide plate 2040. Further, the backlight unit 2000 may further include a reflective plate 2020 disposed on the lower portion of the light guide plate 2040. The backlight unit 2000 in the exemplary embodiment may be an edge type backlight unit.

According to an exemplary embodiment, the light source module 2010 may only be provided on one side of the light guide plate 2040, or may be additionally provided on the other side thereof. The light source module 2010 may include a printed circuit board 2001 and a plurality of light sources 2005 mounted on a top surface of the printed circuit board 2001. The light source 2005 used in this case may be a semiconductor light-emitting device according to the previously described exemplary embodiment.

Referring to FIG. 13, a backlight unit 2100 may include a light diffusing plate 2140 and a light source module 2110 arranged on the lower portion of the light diffusion plate

2140. Further, the backlight unit 2100 may be arranged on the lower portion of the light diffusing plate 2140, and may further include a bottom case 2160 for accommodating the light source module 2110 therein. The backlight unit 2100 in the exemplary embodiment may be a direct type backlight unit.

The light source module 2110 may include a printed circuit board 2101 and a plurality of light sources 2105 mounted on a top surface of the printed circuit board 2101. The light source 2015 used in this case may be a semiconductor light-emitting device according to the previously described exemplary embodiment.

Figure 14:
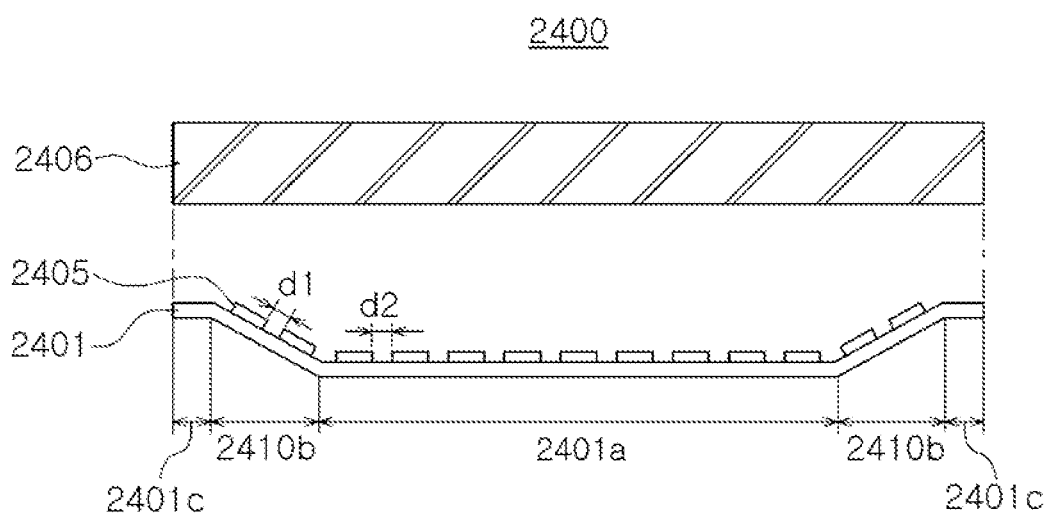
FIG. 14 is a cross-sectional view illustrating a direct-type backlight unit according to an exemplary embodiment.

FIG. 14 is a cross-sectional view illustrating a direct type backlight unit according to an exemplary embodiment.

Referring to FIG. 14, a backlight unit 2400 may include a light source 2405 mounted on a circuit board 2401, and one or more optical sheets 2406 disposed on the upper portion of the light source 2405.

The light source 2405 may be provided as a white light-emitting device containing a red phosphor according to an exemplary embodiment, and the light source 2405 used in this case may be provided as the semiconductor light-emitting device according to the previously described exemplary embodiment.

The circuit board 2401 employed in the exemplary embodiment may have a first flat surface portion 2401a corresponding to a main area, an inclined portion 2401b disposed around the main area, in which at least a portion thereof may be inclined, and a second flat surface portion 2401c disposed on an edge of the circuit board 2401 which is an external side of the inclined portion 2401b. On the first flat surface portion 2401a, the light sources 2405 may be arranged to have a first interval D2 therebetween, and on the inclined portion 2401b, at least one or more light sources 2405 may also be arranged to have a second interval D1 therebetween. The first interval d1 may be identical to the second interval d2. A width (or a length thereof in cross-section) of the inclined portion 2401b may be shorter than a width of the first flat surface portion 2401a, and may be formed to be longer than a width of the second flat surface portion 2401c. In addition, at least one light source 2405 may be arranged as necessary on the second flat surface portion 2401c.

A gradient of the inclined portion 2401b may be adequately adjustable within a range of being greater than 0° and less than 90°, based on the first flat surface portion 2401a. By taking such a structure, the circuit board 2401 may maintain a uniform degree of brightness even in the vicinity of the edge of the optical sheet 2406.

Figure 15:
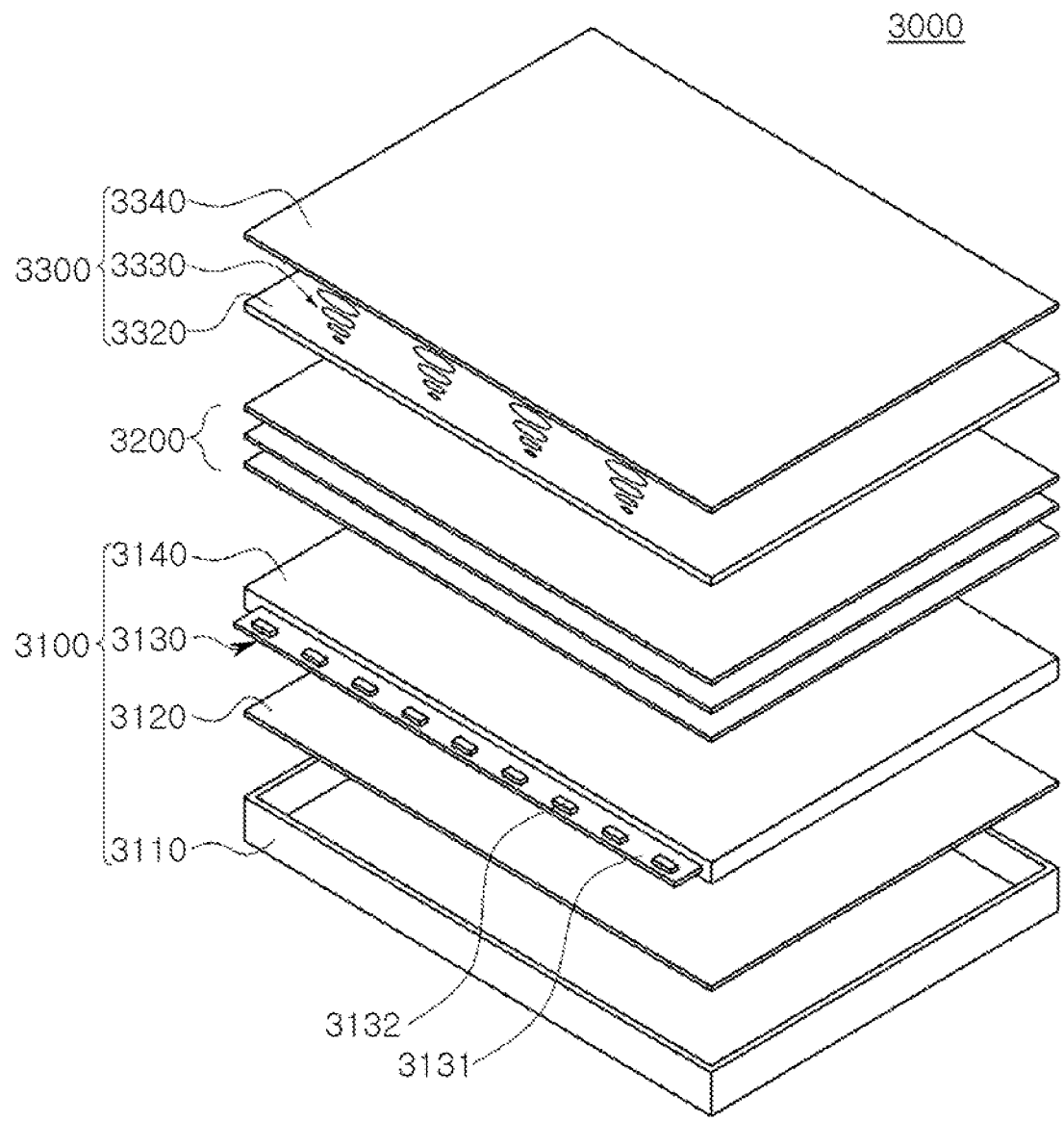
FIG. 15 is an exploded perspective view illustrating a display device according to an exemplary embodiment.

FIG. 15 is an exploded perspective view illustrating a display device according to an exemplary embodiment.

Referring to FIG. 15, a display device 3000 may include a backlight unit 3100, an optical sheet 3200, and an image display panel 3300 such as a liquid crystal panel.

The backlight unit 3100 may include a bottom case 3110, a reflector 3120, a light guide plate 3140, and a light source module 3130 provided on at least one side of the light guide plate 3140. The light source module 3130 may include a printed circuit board 3131 and a light source 3132. The light source 3132 used in this case may be provided as the semiconductor light-emitting device according to the previously described exemplary embodiment.

The optical sheet 3200 may be disposed between the light guide plate 3140 and the image display panel 3300, and may include various types of sheets such as a diffusion sheet, a prism sheet, or a protective sheet.

The image display panel 3300 may display an image using light emitted from the optical sheet 3200. The image display panel 3300 may include an array substrate 3320, a liquid crystal layer 3330, and a color filter substrate 3340. The array substrate 3320 may include pixel electrodes arranged in a matrix form, thin-film transistors applying a driving voltage to the pixel electrodes, and signal lines for operating the thin-film transistors. The color filter substrate 3340 may include a transparent substrate, a color filter, and a common electrode. The color filter may include filters for selectively passing white light of a particular wavelength in white light emitted from the backlight unit 3100. The liquid crystal layer 3330 may control light transmittance by being rearranged by an electrical field formed between the pixel electrodes and the common electrode. The light transmittance-adjusted light may be passed through the color filter of the color filter substrate 3340 to display an image. The image display panel 3300 may further include a driving circuit unit for processing video signals and the like.

According to the display device 3000 in the exemplary embodiment, since the display device 3000 employs a light source 3132 that emits blue light, green light, and red light having a relatively small full width at half maximum therein, the emitted light may implement blue, green, and red colors having high levels of color purity after passing through the color filter substrate 3340.

FIG. 16 is a perspective view illustrating a lighting device according to an exemplary embodiment.

Referring to FIG. 16, a planar lighting device 4100 may include a light source module 4110, a power supply device 4120, and a housing 4030. According to the exemplary embodiment, the light source module 4110 may include a light source array, and the light source 2015 used in this case may be a semiconductor light-emitting device according to the previously described exemplary embodiment. The power supply device 4120 may include a light-emitting diode driving unit.

The light source module 4110 may include a light source array, and may be formed to have an overall planar shape. According to the exemplary embodiment, the light source module 4110 may include a light-emitting diode and a controller storing driving information of the light-emitting diode.

The power supply device 4120 may be configured to supply power to the light source module 4110. A receiving space to allow the light source module 4110 and the power supply device 4120 to be received therein may be formed in the housing 4130, and the housing 4130 may be formed in a hexahedral shape with an open side, but is not limited thereto. The light source module 4110 may be disposed to emit light through the open one side of the housing 4130.

FIG. 17 is an exploded perspective view of a bulb-type lighting device according to an exemplary embodiment.

A lighting device 4200 illustrated in FIG. 17 may include a socket 4210, a power unit 4220, a heat-radiating unit 4230, a light source module 4240, and an optical unit 4250. According to an illustrative exemplary embodiment, the light source module 4240 may include a light-emitting diode array, and the power unit 4220 may include a light-emitting diode driving unit.

The socket 4210 may be configured to be replaced with an existing lighting device. Power supplied to the lighting device 4200 may be applied through the socket 4210. As illustrated, the power unit 4220 may be divided into a first power unit 4221 and a second power unit 4222 and may be assembled. The heat-radiating unit 4230 may include an internal heat-radiating unit 4231 and an external heat-radiating unit 4232. The internal heat-radiating unit 4231 may be connected directly to the light source module 4240 and/or the power unit 4220, through which heat may be transferred to the external heat-radiating unit 4232. The optical portion 4250 may include an internal optical unit (not illustrated) and an external optical unit (not illustrated), and may be configured to evenly distribute light emitted from the light source module 4240.

The light source module 4240 may receive power from the power source unit 4220 and emit light to the optical unit 4250. The light source module 4240 may include one or more light sources 4241, a circuit board 4242, and a controller 4243, and the controller 4243 may store driving information of light-emitting diodes 4241. The light source 4241 used in this case may be a semiconductor light-emitting device according to the previously described exemplary embodiment.

The lighting device 4300 according to the exemplary embodiment may include a reflecting plate 4310 above the light source module 4240, and the reflecting plate 4310 may reduce glare by allowing light from the light source to be dispersed evenly to the side and rear.

A communications module 4320 may be mounted on the upper portion of the reflecting plate 4310, through which home-network communications may be implemented. For example, the communications module 4320 may be a wireless communications module using ZigBee®, Wi-Fi, or Li-Fi and may control lights installed in and around the home, such as turning a lighting device on/off or adjusting brightness, via a smartphone or a wireless controller. In addition, with the use of a Li-Fi communications module with a visible light wavelength of lighting devices installed in and around the home, electronics and automotive systems in and around the home such as TVs, refrigerators, air conditioners, door locks, and automobiles may be controlled.

The reflecting plate 4310 and the communications module 4320 may be covered by a cover unit 4330.

FIG. 18 is an exploded perspective view of a tubular lighting device according to an exemplary embodiment.

A lighting device 4400 illustrated in FIG. 18 may include a heat-radiating member 4410, a cover 4441, a light source module 4450, a first socket 4460, and a second socket 4470. A plurality of heat-radiating fins 4420 and 4431 on the inner and/or outer surfaces of the heat-radiating member 4410 in a corrugated form, and the heat-radiating fins 4420 and 4431, may be designed to have various shapes and spacings. A support portion 4432 may be formed in a protruding form on an inner side of the heat-radiating member 4410. The light source module 4450 may be fixed to the supporting portion 4432. Locking projections 4433 may be formed on both sides of the radiating member 4410.

Locking grooves 4442 may be formed in the cover 4441, and the locking projections 4433 of the heat-radiating member 4410 may be coupled to the locking grooves 4442 in a hook coupling structure. Locations in which the locking grooves 4442 and the locking projections 4433 are formed may be interchangeable with each other.

The light source module 4450 may include a light source array. The light source module 4450 may include a printed circuit board 4451, a light source 4452, and a controller 4453. The light source 4452 used in this case may be a semiconductor light-emitting device according to the previously described exemplary embodiment. As described above, the controller 4453 may store driving information of the light source 4452. Circuit wiring for operating the light source 4452 may be formed in the printed circuit board 4451. In addition, the light source module 4450 may include configuration elements for operating the light source 4452.

The first and second sockets 4460 and 4470 as a pair of sockets may have a structure of being coupled to both ends of a cylindrical cover unit configured of the heat-radiating member 4410 and the cover 4441. For example, the first socket 4460 may include an electrode terminal 4461 and a power device 4462, and a dummy terminal 4471 may be disposed on the second socket 4470. In addition, an optical sensor and/or a communications module may be provided in either of the first socket 4460 or the second socket 4470. For example, an optical sensor and/or a communications module may be provided in the second socket 4470 in which the dummy terminal 4471 is provided. As another example, an optical sensor and/or a communications module may be provided in the first socket 4460 in which the electrode terminal 4461 is disposed.

As set forth above, according to various exemplary embodiments, re-incident light in the semiconductor LED chip may be reduced to decrease light loss due to total internal reflection by disposing a side surface inclined portion on the side of the semiconductor LED chip to form an inclined surface on the side surface of the semiconductor LED chip. Furthermore, light extraction efficiency may be additionally increased by including a wavelength conversion material or light dispersing material to the side surface inclined portion, and in detail, color deviation may be improved.

While exemplary embodiments have been shown and described above, it will be apparent to those skilled in the art that modifications and variations could be made without departing from the scope of the inventive concept as defined by the appended claims.

What is claimed is:

1. A semiconductor light-emitting device comprising:
   a substrate comprising a first circuit pattern, a second circuit pattern, and a mounting surface;
   a semiconductor light-emitting diode (LED) chip mounted on the mounting surface of the substrate, having a first surface which faces the mounting surface and on which a first electrode and a second electrode are disposed, a second surface disposed opposite to the first surface, and side surfaces disposed between the first surface and the second surface, the first electrode being connected to the first circuit pattern, the second electrode being connected to the second circuit pattern;
   a wavelength conversion film containing a wavelength conversion material and disposed on the second surface of the semiconductor LED chip, the wavelength conversion film having a top surface, a bottom surface disposed opposite to the top surface, and side surfaces disposed between the top surface and the bottom surface, wherein in a plan view the wavelength conversion film covers no more than one semiconductor LED chip;
   a side surface inclined portion disposed on the side surfaces of the semiconductor LED chip, and having a side surface that is inclined inwardly toward the mounting surface of the substrate such that a width of an upper portion of the side surface inclined portion is greater than a width of a lower portion of the side surface inclined portion, the side surface inclined portion comprising a light-transmitting resin;
   a side surface reflection portion disposed on the mounting surface of the substrate and surrounding the side surface inclined portion, the side surface reflection portion contacting a bottom surface of the wavelength conversion film and having an outer surface extending from the side surface of the wavelength conversion film toward the mounting surface of the substrate; and a light-transmitting adhesive layer disposed between the wavelength conversion film and the semiconductor LED chip, wherein the light-transmitting adhesive layer and the side surface inclined portion do not include the wavelength conversion material.

2. The semiconductor light-emitting device of claim 1, wherein the first end of the outer surface contacts an upper edge of the one of the side surfaces of the wavelength conversion film.

3. The semiconductor light-emitting device of claim 1, wherein the semiconductor LED chip further comprises
 a semiconductor laminate disposed on the substrate, and including a first conductivity-type semiconductor layer, a second conductivity-type semiconductor layer and an active layer interposed therebetween,
 an insulating portion disposed on the semiconductor laminate, and electrically isolating the first electrode and the second electrode from each other,
 wherein the first electrode includes a connecting electrode portion that penetrates through the second conductivity-type semiconductor layer and the active layer and is connected to the first conductivity-type semiconductor layer, and a first electrode pad that is connected to the connecting electrode portion, and
 wherein the second electrode includes an ohmic contact layer that is disposed on the second conductivity-type semiconductor layer, and a second electrode pad that is connected to the ohmic contact layer.

4. The semiconductor light-emitting device of claim 3, wherein the connecting electrode portion is arranged to form rows and columns on the semiconductor laminate.

5. The semiconductor light-emitting device of claim 3, wherein the insulating portion comprises a multilayer reflective structure in which a first insulating films having a first refractive index and a second insulating films having a second refractive index different from the first refractive index are alternately stacked.

6. The semiconductor light-emitting device of claim 3, wherein the connecting electrode portion and the ohmic contact layer comprise at least one selected from a group consisting of Ag, Al, Ni, Cr, and a transparent conductive oxide.

7. The semiconductor light-emitting device of claim 3, wherein the first and second electrode pads comprise at least one selected from a group consisting of Au, Ag, Al, Ti, W, Cu, Sn, Ni, Pt, Cr, NiSn, TiW, and AuSn.

8. The semiconductor light-emitting device of claim 1, wherein a first width of the first electrode and a second width of the second electrode are substantially the same in a first direction parallel to the mounting surface of the substrate.

9. The semiconductor light-emitting device of claim 8, wherein a third width of the first circuit pattern and a fourth width of the second circuit pattern are substantially the same in the first direction.

10. The semiconductor light-emitting device of claim 1, wherein the wavelength conversion film has an area greater than an area of the semiconductor LED chip.

11. The semiconductor light-emitting device of claim 1, further comprising an optical lens disposed on the mounting substrate, and covering at least the top surface of the wavelength conversion film.

12. The semiconductor light-emitting device of claim 1, wherein the light-transmitting adhesive layer comprises a same light-transmitting resin as the light-transmitting resin of the side surface inclined portion.

13. The semiconductor light-emitting device of claim 1, wherein the light-transmitting resin contain a light dispersing material.

14. The semiconductor light-emitting device of claim 1, wherein the light-transmitting resin has a refractive index selected from with a range of 1.38 to 1.8.

15. The semiconductor light-emitting device of claim 1, wherein the side surface reflection portion comprises a light-transmitting resin and a reflective powder contained in the light-transmitting.

16. The semiconductor light-emitting device of claim 1, wherein the wavelength conversion material comprises a yellow phosphor.

17. A semiconductor light-emitting device comprising:
 a substrate having a mounting surface, and a first circuit pattern and a second circuit pattern, the first circuit pattern and the second circuit pattern disposed on the mounting surface;
 a semiconductor light-emitting diode (LED) chip mounted on the mounting surface of the substrate, having a first surface which faces the mounting surface and on which a first electrode and a second electrode are disposed, a second surface disposed opposite to the first surface, and side surfaces disposed between the first surface and the second surface, the first electrode being connected to the first circuit pattern, the second electrode being connected to the second circuit pattern;
 a wavelength conversion film containing a wavelength conversion material and disposed on the second surface of the semiconductor LED chip, the wavelength conversion film having a top surface, a bottom surface disposed opposite to the top surface, and side surfaces disposed between the top surface and the bottom surface, wherein in a plan view the wavelength conversion film covers no more than one semiconductor LED chip;
 a side surface inclined portion disposed on the side surfaces of the semiconductor LED chip, and having a side surface inclined inwardly toward the mounting surface of the substrate such that a width of an upper portion of the side surface inclined portion is greater than a width of a lower portion of the side surface inclined portion, and comprising a light-transmitting resin;
 a side surface reflection portion disposed on the mounting surface of the substrate and surrounding the side surface inclined portion, the side surface reflection portion contacting the side surfaces of the wavelength conversion film and having an outer surface that extends from the side surfaces of the wavelength conversion film toward the mounting surface of the substrate; and
 a light-transmitting adhesive layer disposed between the wavelength conversion film and the semiconductor LED chip,
 wherein the light-transmitting adhesive layer and the side surface inclined portion do not include the wavelength conversion material.

18. The semiconductor light-emitting device of claim 17, wherein a width of a lower portion of the side surface reflection portion is greater than a width of an upper portion of the side surface reflection portion.

19. A semiconductor light-emitting device comprising:
 a substrate having a mounting surface, and a first circuit pattern and a second circuit pattern, the first circuit pattern and the second circuit pattern disposed on the mounting surface;

a first semiconductor light-emitting diode (LED) chip mounted on the mounting surface of the substrate, having a first surface which faces the mounting surface and on which a first electrode and a second electrode are disposed, a second surface disposed opposite to the first surface, and side surfaces disposed between the first surface and the second surface, the first electrode being connected to the first circuit pattern, the second electrode being connected to the second circuit pattern;

a wavelength conversion film containing a wavelength conversion material and disposed on the second surface of the first semiconductor LED chip, the wavelength conversion film having a top surface, a bottom surface disposed opposite to the top surface, and side surfaces disposed between the top surface and the bottom surface;

a side surface inclined portion disposed on the side surfaces of the first semiconductor LED chip, and having a side surface inclined inwardly toward the mounting surface of the substrate, and comprising a light-transmitting resin;

a side surface reflection portion disposed on the mounting surface of the substrate and surrounding the side surface inclined portion, the side surface reflection portion contacting the side surface of the wavelength conversion film, a width of a lower portion of the side surface reflection portion being greater than a width of an upper portion of the side surface reflection portion; and a light-transmitting adhesive layer disposed between the wavelength conversion film and the first semiconductor LED chip, wherein the light-transmitting adhesive layer and the side surface inclined portion do not include the wavelength conversion material, and no other semiconductor LED chip other than the first semiconductor LED chip is disposed directly below the wavelength conversion film.

20. The semiconductor light-emitting device of claim 19, wherein the side surface reflection portion has an outer surface extending from an edge of the top surface of the wavelength conversion film toward the mounting surface of the substrate.

* * * * *